(12) United States Patent
Lin

(10) Patent No.: US 11,901,875 B2
(45) Date of Patent: Feb. 13, 2024

(54) SURFACE ACOUSTIC WAVE SENSOR ASSEMBLY

(71) Applicant: Applied Materials, Inc., Santa Clara, CA (US)

(72) Inventor: Chuang-Chia Lin, San Ramon, CA (US)

(73) Assignee: Applied Materials, Inc., Santa Clara, CA (US)

(*) Notice: Subject to any disclaimer, the term of this patent is extended or adjusted under 35 U.S.C. 154(b) by 467 days.

(21) Appl. No.: 17/068,725

(22) Filed: Oct. 12, 2020

(65) Prior Publication Data
US 2022/0116013 A1    Apr. 14, 2022

(51) Int. Cl.
H03H 9/02    (2006.01)
H10N 30/30   (2023.01)

(52) U.S. Cl.
CPC .... *H03H 9/02842* (2013.01); *H03H 9/02543* (2013.01); *H10N 30/302* (2023.02)

(58) Field of Classification Search
CPC ........... H03H 9/02842; H03H 9/02543; H10N 30/302; H01L 41/1132
USPC ...... 310/313 R, 313 A, 313 B, 313 C, 313 D
See application file for complete search history.

(56) References Cited

U.S. PATENT DOCUMENTS

| | | | |
|---|---|---|---|
| 7,233,874 B2 | 6/2007 | Ye et al. | |
| 7,977,609 B2 | 7/2011 | Sata et al. | |
| 8,080,767 B2 | 12/2011 | Yamaga et al. | |
| 8,089,031 B2 | 1/2012 | Yamaga | |
| 8,089,196 B1* | 1/2012 | Cular | G01N 29/022 |
| | | | 310/313 R |
| 9,121,754 B2 | 9/2015 | Hines | |
| 9,975,758 B2 | 5/2018 | Tedeschi et al. | |
| 10,083,883 B2 | 9/2018 | Tedeschi et al. | |
| 2003/0053936 A1 | 3/2003 | Potyrailo | |
| 2005/0284570 A1 | 12/2005 | Doran et al. | |

(Continued)

FOREIGN PATENT DOCUMENTS

| | | |
|---|---|---|
| CN | 201535702 U | 7/2010 |
| JP | 2004279397 A | 10/2004 |

(Continued)

OTHER PUBLICATIONS

International Search Report and Written Opinion for International application No. PCT/US2021/054427; dated Jan. 26, 2022, 11 pages.

(Continued)

*Primary Examiner* — Derek J Rosenau
(74) *Attorney, Agent, or Firm* — Lowenstein Sandler LLP

(57) ABSTRACT

A sensor device that includes an integrated sensor assembly having a surface acoustic wave (SAW) sensor disposed on a piezoelectric substrate. The SAW sensor is adapted to measure an environmental condition of an environment in response to an RF signal. The SAW sensor includes an interdigitated transducer (IDT) formed on a substrate having at least a layer of a piezoelectric material. The SAW sensor includes either one or more SAW reflectors of a second IDT formed on the piezoelectric material. The SAW sensor further includes an RF antenna formed on the piezoelectric material. The SAW sensor and the RF antenna are integrated with one another on the piezoelectric material.

14 Claims, 13 Drawing Sheets

(56) References Cited

U.S. PATENT DOCUMENTS

| | | |
|---|---|---|
| 2006/0049714 A1* | 3/2006 | Liu .................... G01S 13/755 310/313 R |
| 2006/0254356 A1 | 11/2006 | Liu et al. |
| 2008/0088201 A1* | 4/2008 | Konishi ............ G06K 19/0716 310/313 D |
| 2012/0174678 A1 | 7/2012 | Gallagher et al. |
| 2012/0270169 A1 | 10/2012 | Yamaga |
| 2017/0016773 A1 | 1/2017 | Arai et al. |
| 2017/0221783 A1 | 8/2017 | Tedeschi et al. |
| 2019/0057887 A1 | 2/2019 | Ballandras et al. |
| 2019/0385875 A1 | 12/2019 | Wu |
| 2020/0408612 A1 | 12/2020 | Wu et al. |
| 2022/0116013 A1 | 4/2022 | Lin |

FOREIGN PATENT DOCUMENTS

| | | |
|---|---|---|
| JP | 2004347451 A | 12/2004 |
| JP | 4175085 B2 | 11/2008 |
| JP | 5341381 B2 | 11/2013 |
| JP | 2016019282 A | 2/2016 |
| JP | 2017133849 A | 8/2017 |
| JP | 2017156123 A | 9/2017 |
| KR | 101616639 B1 | 4/2016 |
| KR | 20190115889 A | 10/2019 |
| KR | 20190115890 A | 10/2019 |
| KR | 102064901 B1 | 2/2020 |
| KR | 102117352 B1 | 6/2020 |
| WO | 2006138662 A1 | 12/2006 |
| WO | 2019017539 A1 | 1/2019 |

OTHER PUBLICATIONS

International Search Report and Written Opinion for International application No. PCT/US2021/054432; dated Feb. 4, 2022, 12 pages.

\* cited by examiner

400

410 — Form a first conductive structure onto a piezoelectric substrate, the first conductive structure forming an RF antenna.

420 — Form a second conductive structure onto the piezoelectric substrate, the second conductive structure forming matching circuitry coupled to the RF antenna.

430 — Form a third conductive structure onto the piezoelectric substrate, the third conductive structure forming an interdigitated transducer (IDT) coupled to the RF antenna.

440 — Form a fourth conductive structure onto the piezoelectric substrate, the fourth conductive forming at least one of a a) one or more SAW reflectors or b) a second IDT.

450 — Form a fifth conductive structure onto the piezoelectric substrate, the fifth conductive forming one or more waveguide disposed between the IDTs.

FIG. 4

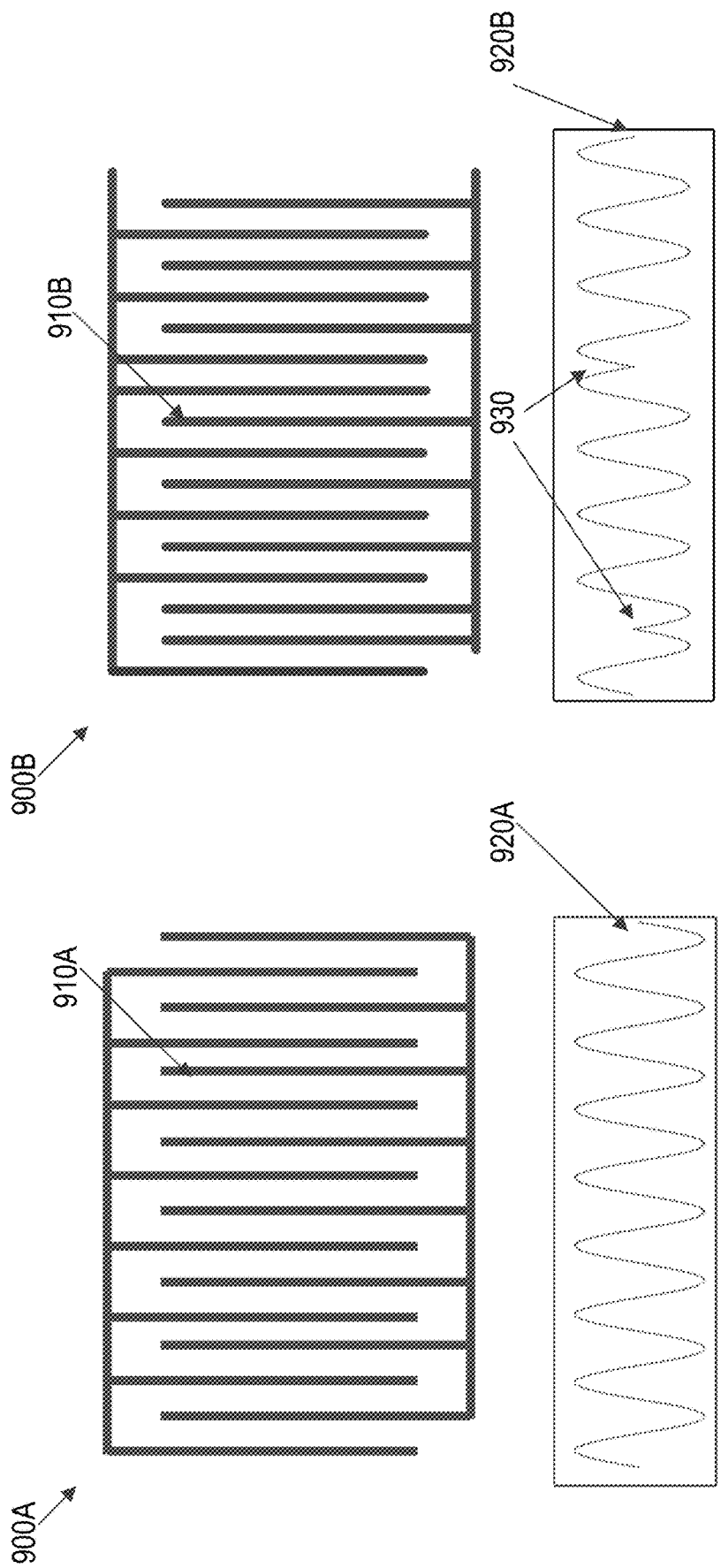

SURFACE ACOUSTIC WAVE SENSOR ASSEMBLY

RELATED APPLICATIONS

This patent application is related to U.S. patent application Ser. No. 17/068,733, filed Oct. 12, 2020, which is incorporated by reference herein.

TECHNICAL FIELD

Some embodiments of the present disclosure relate, in general, to a sensor device having a surface acoustic wave (SAW) sensor assembly to measure an environmental condition of an environment.

BACKGROUND

Surface acoustic waves (SAWs) are sound waves that travel parallel to the surface of an elastic material. The general mathematical discussion of SAW was first reported by Lord Rayleigh in 1855, but the application in electronic devices was not exploited until 1965 by White and Voltmer utilizing interdigital transducer on piezoelectric materials. SAWs are used in a electronic devices, particularly RF/IF filters. The transduction from electrical energy to mechanical energy (in the form of SAWs) is accomplished through the use of piezoelectric materials. Piezoelectric materials are materials that have the ability to generate internal electrical charge from mechanical stress as well as internally generate mechanical strain in response to an applied electric field. A SAW transducer is often used on a surface of piezoelectric materials to convert electrical energy to mechanical energy (e.g., SAWs) as well as convert SAWs into electrical energy. SAW devices may use SAWs in electronic components to provide a number of different functions, including delay lines, filters, resonators, correlators, converters, sensors, and the like. SAW devices can be disposed on wafers to perform their respective functions.

SUMMARY

Some embodiments described herein cover a sensor device including an integrated sensor assembly having a surface acoustic wave (SAW) sensor disposed on a substrate having at least a layer of a piezoelectric material. The SAW sensor may be adapted to measure an environmental condition based on detection of SAW properties responsive to receiving an incoming radio frequency (RF) signal. The SAW sensor may include an interdigitated transducer (IDT) formed on the piezoelectric material. The IDT may generate a SAW based on the environmental condition responsive to receiving the incoming RF signal. The SAW sensor may include one or more SAW reflectors that communicates with the IDT. The SAW sensor may include another IDT to receive the SAW wave and generate an outgoing RF signal. The SAW sensor assembly may further include an RF antenna and matching circuitry. The matching circuitry may be connected to the RF antenna and the IDT. The SAW sensor, the RF antenna, and the matching circuitry may be integrated with each other on the piezoelectric material.

In further embodiments, the sensor assembly may include a second IDT that receives the SAW from the first IDT and generates an oscillating potential associated with an acoustic frequency of the received SAW. This oscillating potential may include information associated with a measured environmental condition across a region of the surface of the piezoelectric substrate or piezoelectric layer. The sensor assembly may include a second RF antenna and second matching circuitry to output an outgoing RF signal associated with the oscillating potential.

In example embodiments, a method is disclosed for fabricating a sensor device. The method may include fabricating an integrated sensor assembly by depositing a first conductive structure onto a substrate having at least a layer of a piezoelectric material, where the first conductive structure forms a radio frequency (RF) antenna. The method may further include depositing a second conductive structure onto the piezoelectric material, where the second conductive structure forms matching circuitry that is connected to the RF antenna. The method may further include depositing a third conductive structure onto the piezoelectric material, where the third conductive structure forms an interdigitated transducer (IDT) connected to the RF antenna, wherein the IDT is a component of a surface acoustic wave (SAW) sensor. The method may further include depositing a fourth conductive structure onto the piezoelectric material, where the fourth conductive structure forms at least one of a) one or more SAW reflectors or b) a second IDT. The first conductive structure, second conductive structure, third conductive structure and/or fourth conductive structure may be formed together in a single deposition operation in some embodiments.

In some embodiments, the sensor assembly may include a SAW sensor adapted to measure an environmental condition responsive to receiving an incoming RF signal. The SAW sensor may include at least a layer of a piezoelectric material disposed on a base substrate. The SAW sensor may further include a first IDT formed on the piezoelectric substrate, where the first IDT operates at a base resonant frequency. The SAW sensor may include a dielectric coating with a thickness or material associated with a shift in the base resonant frequency, where the first IDT with the dielectric coating has an adjusted resonant frequency.

In example embodiments, a method is disclosed for fabricating a sensor assembly. The method may begin with fabricating a SAW sensor by depositing a conducting layer onto a piezoelectric substrate, where the conducting layer forms an interdigitated transducer (IDT) of the SAW sensor. The IDT has a base resonant frequency based, for example, on the pitch between digits in the IDT. The method may continue with tuning a resonant frequency of the IDT by depositing a dielectric coating having a thickness of a material on the conducting layer, where at least the thickness or the material is associated with a shift in the base resonant frequency, where the IDT with the dielectric coating has an adjusted resonant frequency.

In other embodiments, the sensor assembly may include one or multiple SAW sensors adapted to measure an environmental condition responsive to receiving an incoming RF signal. A first SAW sensor may include a substrate having at least a layer of a piezoelectric material and a first IDT formed on the piezoelectric material. The first IDT may include two comb-shaped electrodes comprising interlocking conducting digits disposed in a first arrangement. The interlocking conducting digits in the first arrangement generates a signal modulation of a signal received by the IDT. The signal modulation identifies the SAW sensor.

In other embodiments, the sensor assembly may include a SAW sensor disposed on a substrate having at least a layer of a piezoelectric material. The SAW may be adapted to measure an environmental condition of an environment responsive to receiving an incoming RF signal. The SAW sensor may include an IDT formed on the piezoelectric material. The IDT generates a SAW based on the environmental condition responsive to receiving the incoming RF signal. The SAW sensor may further include a collection of SAW reflectors that have a spatial arrangement that causes the SAW reflected from the SAW reflectors propagating from the SAW reflectors back to the IDT to have a signal modulation that identifies the SAW sensor.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4 is a flow chart of a method for fabricating a SAW sensor assembly, according to aspects of the disclosure.

FIGS. 9A-C depict various embodiments of electrode arrangements of IDTs of a SAW sensor, according to aspects of the disclosure.

DETAILED DESCRIPTION OF EMBODIMENTS

Figure 1:
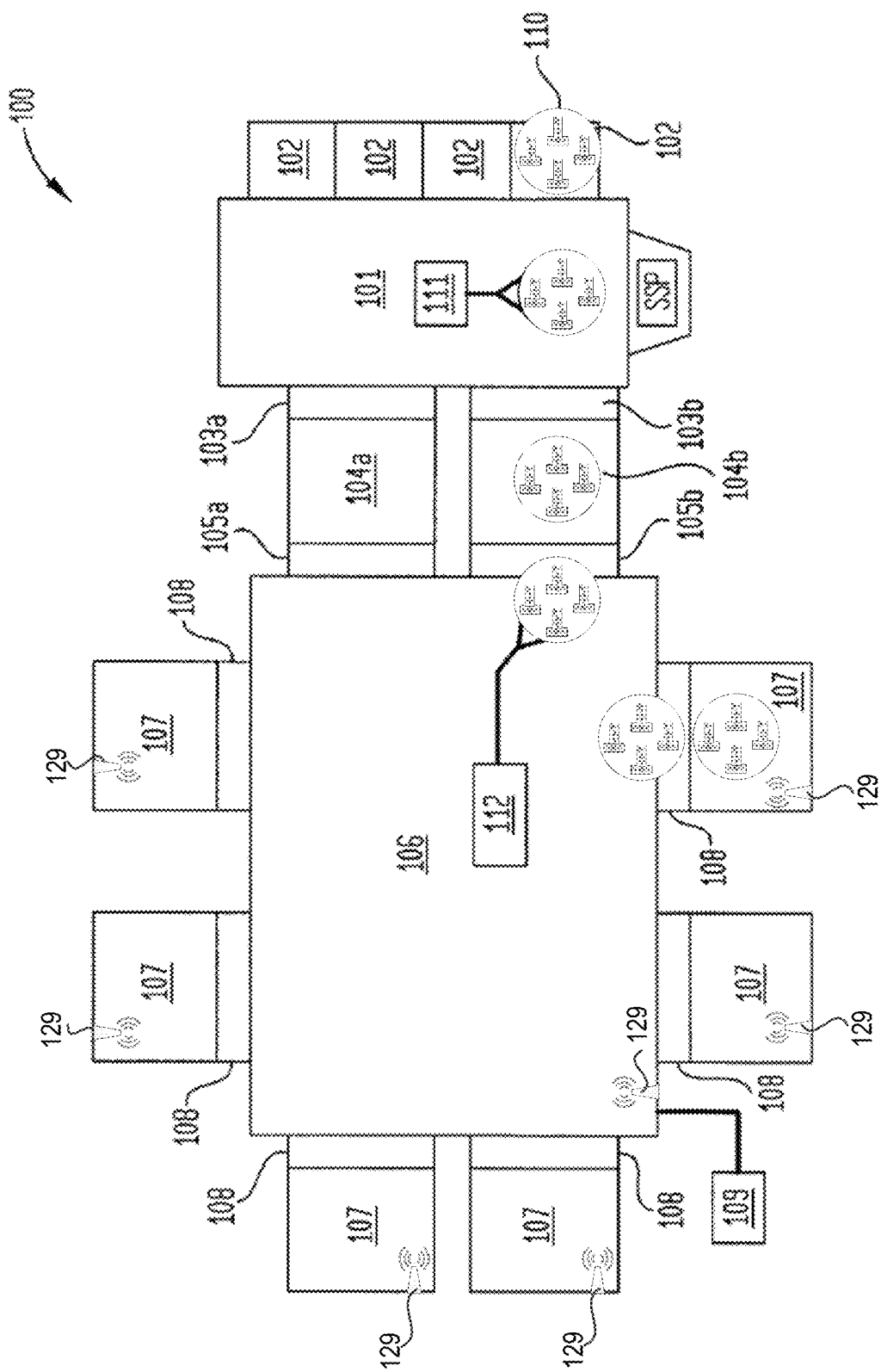
FIG. 1 illustrates a simplified top view of an example processing system, according to aspects of the present disclosure.

Embodiments of the present disclosure provide a sensor device including a SAW sensor assembly and related methods for fabricating a SAW sensor assembly. The SAW sensor assembly may include conductive elements such as antennas, circuitry, and/or interdigitated transducers (IDTs) disposed on a substrate having at least a layer of a piezoelectric material. The SAW sensor assembly may be formed, for example, on a piezoelectric substrate or on another type of substrate such as a semiconductor substrate that has a piezoelectric layer thereon. The SAW sensor receives incoming RF signals and generates SAWs to measure environmental conditions such as pressure and temperature of an environment (e.g., surface of the piezoelectric substrate or piezoelectric layer). Various disclosed embodiments provide a way to measure environmental conditions passively (e.g., without active devices such as a power supply), make measurements over a surface area of a piezoelectric substrate or piezoelectric layer, fine tune SAW sensors, and/or distinguish between various SAW sensors of a sensor assembly.

Various embodiments may be or employ a device having a sensor assembly that includes a SAW sensor disposed on a substrate having at least a layer of a piezoelectric material (e.g., on a piezoelectric substrate or on a piezoelectric layer disposed on a substrate) and that is adapted to measure an environmental condition of an environment responsive to receiving an incoming RF signal. The SAW sensor may include an antenna, matching circuitry, and an interdigitated transducer (IDT) disposed on the surface of the piezoelectric material. The SAW sensor may generate a SAW to measure the environmental condition without using active circuitry (e.g., CMOS devices powered by a battery). The antenna, matching circuitry, and interdigitated transducer may be integrated with one another on the piezoelectric material.

In an example, a sensor device includes an integrated sensor assembly having a SAW sensor disposed on a piezoelectric substrate. The SAW sensor may be adapted to measure an environmental condition of an environment responsive to receiving an incoming radio frequency (RF) signal. The SAW sensor may include an IDT formed on the piezoelectric substrate. The IDT may generate a SAW based on the environmental condition (e.g., having at least one of an amplitude, a frequency, a time delay, a phase or a wavelength that is dependent on the environmental condition) responsive to receiving the incoming RF signal. The SAW sensor may include one or more SAW reflectors that reflect the SAW back to the IDT. The IDT may then generate a new outoing RF signal based on the reflected SAW that is received. For example, the IDT may generate an oscillating electrical potential associated with an acoustic frequency of the reflected SAW. This oscillating potential may include information associated with a measured environmental condition across a region of the surface of the piezoelectric material. The SAW sensor assembly may further include an RF antenna and matching circuitry attached to the first IDT. The matching circuitry may be connected to the RF antenna and the first IDT. The SAW sensor, the RF antenna, and the matching circuitry may be integrated with each other on the piezoelectric material.

In some embodiments, the sensor assembly may include a SAW sensor having two IDTs that are separated by a surface of a piezoelectric substrate or a piezoelectric layer on a substrate. A first IDT may be used to receive an incoming RF signal and generate a SAW that is passed along the surface of the piezoelectric substrate or piezoelectric layer to the other IDT. The other IDT may receive the SAW and generate an oscillating potential associated with the acoustic frequency of the SAW. This oscillating potential may include information associated with a measured environmental condition (e.g., temperature, pressure, or the like), where the environment includes the region between the IDTs. Each IDT may be coupled to an RF antenna through matching circuitry.

In an example, in addition to or instead of including one or more reflectors, the SAW sensor may include two IDTs (one to generate a SAW and the other to receive the SAW and generate a new outgoing RF signal therefrom). The additional IDT generates an oscillating electrical potential associated with an acoustic frequency of the received SAW. This oscillating potential may include information associated with a measured environmental condition across a region of the surface of the piezoelectric material (e.g., the piezoelectric substrate or piezoelectric layer). In embodiments that include a second IDT, the SAW sensor assembly may further include a second RF antenna to output the new outgoing RF signal and second matching circuitry coupled to the second RF antenna and the additional IDT. The second RF antenna and the second matching circuitry may be integrated with each other and with the SAW sensor, the RF antenna and the matching circuitry on the piezoelectric material.

In example embodiments, a method is disclosed for fabricating a sensor device. The method may include fabricating an integrated sensor assembly by depositing a first conductive structure onto a substrate having at least a layer of a piezoelectric material, where the first conductive structure forms a radio frequency (RF) antenna. The method may further include depositing a second conductive structure onto the piezoelectric material, where the second conductive structure forms matching circuitry that is connected to the RF antenna. The method may further include depositing a third conductive structure onto the piezoelectric material, where the third conductive structure forms an interdigitated transducer (IDT) connected to the RF antenna, wherein the IDT is a component of a surface acoustic wave (SAW) sensor. The method may further include depositing a fourth conductive structure onto the piezoelectric material, where the fourth conductive structure forms at least one of a) one or more SAW reflectors or b) a second IDT. The first conductive structure, second conductive structure, third conductive structure and/or fourth conductive structure are formed together in a single deposition operation in some embodiments. Alternatively, multiple deposition operations may be performed, with each deposition operations forming one or more of the first conductive structure, the second conductive structure, the third conductive structure and the fourth conductive structure. These conductive structures may each be planar conductors in embodiments. By fabricating a sensor device having all of the components in one integrated device enables the use of a smaller sensor device that in turn can reduce manufacturing cost, time, and reduce the required number of manufacturing steps.

In embodiments, the sensor assembly includes a SAW sensor having a first IDT disposed on a piezoelectric material that operates at a base resonant frequency. The first IDT may include a dielectric coating with a thickness and/or material associated with a shift in the base resonant frequency, where the first IDT with the dielectric coating has an adjusted resonant frequency. In a further embodiment, the sensor assembly may include various SAW sensors, each having IDTs with dielectric coatings of different thicknesses and/or materials that cause each respective IDT to have a different adjusted resonant frequency. Each unique frequency may allow a reader to receive outgoing RF signals generated by the different SAW sensors and to distinguish between those outgoing RF signals. This enables a sensor wafer to be manufactured that includes multiple (e.g., 5-20 or more) SAW sensors to be disposed on the same sensor wafer. Signals generated by each of the SAW sensors on the sensor wafer may be received by the reader. The reader (or a controller connected thereto) may then determine which of the SAW sensors generated each particular outgoing RF signal based on the frequency of that outgoing RF signal. This enables the detector and/or controller to determine different environmental conditions across different locations of the sensor wafer.

In example embodiments, a method is disclosed for fabricating a sensor assembly. The method may begin with fabricating a SAW sensor by depositing a conducting layer onto a piezoelectric substrate, where the conducting layer forms an interdigitated transducer (IDT) of the SAW sensor. The IDT has a base resonant frequency based, for example, on the pitch between digits in the IDT. The method may continue with tuning a resonant frequency of the IDT by depositing a dielectric coating having a thickness of a material on the conducting layer, where at least the thickness or the material is associated with a shift in the base resonant frequency, where the IDT with the dielectric coating has an adjusted resonant frequency.

In some embodiments, the sensor assembly has a SAW sensor that includes an IDT having two comb-shaped electrodes including interlocking conducting digits in an arrangement. The arrangement of interlocking conducting digits may generate a signal modulation of a signal passed through the IDT. This signal modulation may identify the SAW sensor. In addition, or in the alternative, the sensor assembly may have a SAW sensor that includes an IDT and a collection of SAW reflectors that have a spatial arrangement that causes the reflected SAWs to have a signal modulation that identifies the SAW sensor.

In an example, the sensor assembly may include multiple SAW sensors adapted to measure an environmental condition responsive to receiving an incoming RF signal. A first SAW sensor may include a piezoelectric substrate and a first IDT formed on the piezoelectric substrate. The first IDT may include two comb-shaped electrodes comprising interlocking conducting digits disposed in a first arrangement. The interlocking conducting digits in the first arrangement generates a signal modulation of a signal received by the IDT. The signal modulation identifies the SAW sensor. A second SAW sensor may include a second IDT formed on the piezoelectric substrate (or on a different piezoelectric substrate). The second IDT may include two comb-shaped electrodes comprising interlocking conducting digits disposed in a second arrangement. The interlocking conducting digits in the second arrangement generates a second signal modulation of a signal received by the second IDT. The second signal modulation identifies the second SAW sensor. Thus, RF signals output by the first and second SAW sensors may be identified based on their associated signal modulations. This enables a sensor wafer to be manufactured that includes multiple (e.g., 5-20 or more) SAW sensors to be disposed on the same sensor wafer. Signals generated by each of the SAW sensors on the sensor wafer may be received by the reader. The reader (or a controller connected thereto) may then determine which of the SAW sensors generated each particular RF signal based on the frequency of that RF signal. This enables the detector and/or controller to determine different environmental conditions across different locations of the sensor wafer.

Any of the above disclosed embodiments may be combined. For example, a sensor wafer may include a first SAW sensor with a first dielectric coating, a first arrangement of digits of an IDT and/or a first arrangement of reflectors and a second SAW sensor with a second dielectric coating, a second arrangement of digits of an IDT, and/or a second arrangement of reflectors. The first and second SAW sensors may optionally each be part of respective integrated sensor assemblies that include respective antennas and matching networks. In some embodiments, the integrated sensor assemblies of multiple SAW sensors are included on a shared piezoelectric substrate or other substrate with a piezoelectric layer disposed thereon.

These and similar embodiments provide a number of advantages and improvements in the field of fabrication and signal processing of sensor assemblies such as SAW sensors and sensor wafers that include one or more SAW sensors disposed on the sensor wafer. These advantages include improvements in SAW sensor assemblies such as improved SAW sensor performance, broader applicable use of SAW sensors, increased signal differentiation between SAW sensors, and reduced manufacturing costs and fabrication complexities of SAW sensors.

Sensor performance may be improved, for example, by a sensor assembly that uses passive circuitry (e.g., SAW sensors). The passive circuitry allows the measurement of environmental conditions at more extreme levels (e.g., high temperatures and pressures) by not being restricted to an active device's specification limitations. Broader applicable use of SAW sensors may be achieved, for example, by using IDTs the are coupled to unique antennas. IDTs coupled to unique antennas can be used to measure environmental conditions across a wider environment by sending SAW between IDTs disposed across a broad area of a piezoelectric substrate. Increased signal differentiation between SAW sensors may be achieved, for example, by generating a sensor assembly with SAW sensors that are tuned to operate at different frequencies by applying a dielectric coating with a unique thickness or material. Alternatively, or additionally, the SAW sensors may generate unique signal modulations on signals passing through each respective SAW sensor. The signal modulation may be generated using arrangements of interlocking conducting digits of the IDT electrode and/or spatial arrangements of SAW reflectors.

FIG. 1 illustrates a simplified top view of an example processing system 100, according to aspects of the present disclosure. The processing system 100 includes a factory interface 91 to which a plurality of substrate cassettes 102 (e.g., front opening pods (FOUPs) and a side storage pod (SSP)) may be coupled for transferring substrates (e.g., wafers such as silicon wafers) into the processing system 100. The FOUP, SSP, and other substrate cassettes may together be referred to herein as storage locations. In some embodiments, one or more of the substrate cassettes 102 include, in addition to or instead of wafers to be processed, one or more sensor wafers 110 having SAW sensor assemblies disposed thereon or integrated therein. The SAW sensor assemblies of the sensor wafers 110 may be used to measure environmental conditions (e.g., temperature, pressure, or the like) of an environment. For example, the sensor wafers 110 may be used to measure an environmental condition within one or more processing chambers 107 and other compartments and chambers as will be discussed. The factory interface 91 may also transfer the sensor wafers 110 into and out of the processing system 100 using the same functions for transferring wafers to be processed and/or that have been processed, as will be explained.

The processing system 100 may also include first vacuum ports 103a, 103b that may couple the factory interface 91 to respective stations 104a, 104b, which may be, for example, degassing chambers and/or load locks. Second vacuum ports 105a, 105b may be coupled to respective stations 104a, 104b and disposed between the stations 104a, 104b and a transfer chamber 106 to facilitate transfer of substrates into the transfer chamber 106. The transfer chamber 106 includes multiple processing chambers 107 (also referred to as process chambers) disposed around the transfer chamber 106 and coupled thereto. The processing chambers 107 are coupled to the transfer chamber 106 through respective ports 108, such as slit valves or the like.

The processing chambers 107 may include one or more of etch chambers, deposition chambers (including atomic layer deposition, chemical vapor deposition, physical vapor deposition, or plasma enhanced versions thereof), anneal chambers, and/or the like. The processing chambers 107 may include chamber components such as a showerhead or a chuck (e.g., electrostatic chuck), for example.

In various embodiments, the factory interface 91 includes a factory interface robot 111. The factory interface robot 111 may include a robot arm, which may be or include a selective compliance assembly robot arm (SCARA) robot, such as a 2 link SCARA robot, a 3 link SCARA robot, a 4 link SCARA robot, and so on. The factory interface robot 111 may include an end effector on an end of the robot arm(s). The end effector may be configured to pick and handle specific objects, such as wafers. The factory interface robot 111 may be configured to transfer objects between substrate cassettes 102 (e.g., FOUPs and/or SSP) and stations 104a, 104b (e.g., which may be load locks).

The transfer chamber 106 includes a transfer chamber robot 112. The transfer chamber robot 112 may include a robot arm with an end effector at an end of the robot arm. The end effector may be configured to handle particular objects, such as wafers, edge rings, ring kits, and/or sensor wafers 110. The transfer chamber robot 112 may be a SCARA robot, but may have fewer links and/or fewer degrees of freedom than the factory interface robot 111 in some embodiments.

The processing system may include one or more RF antennas 129 in the processing chambers 107. The RF antennas 129 may be disposed on or within the walls of the processing chambers 107 in embodiments. The RF antennas may be disposed within chamber components in some embodiments. For example RF antennas 129 may be disposed within a chuck (e.g., an electrostatic chuck) or a showerhead of a processing chamber. One or more RF antennas 129 may additionally or alternatively be disposed within the transfer chamber 106, within a load lock (e.g., load locks 104a, 104b), within the FI 101 and/or within the cassettes 102.

The RF antennas 129 may be communicatively coupled to the SAW sensor assemblies on a sensor wafer 110. For example, RF signals can be sent from RF antennas 129 to SAW sensor assemblies on a sensor wafer 110 and a return signal can be generated by the SAW sensor assemblies and received by the same RF antenna or another RF antenna 129. The return signal may include information indicative of a measurement of an environmental condition of an environment within a processing chamber, load lock, transfer chamber, and so on (e.g., on the surface of the SAW sensor assembly). The RF antennas may be connected to transceivers that generate RF signals and/or that receive RF signals. In some embodiments, one or more RF antennas associated with a processing chamber are connected to an RF transmitter and one or more RF antennas associated with the processing chamber are connected to an RF receiver. The sensor wafers may not include any power components (e.g., any batteries), and may instead be powered by the received RF signals generated by the RF antennas 129. Thus, the sensor wafers may be passive devices.

A controller 109 may control various aspects of the processing system 100 and may be communicatively coupled to RF antennas 129. The controller 109 may be and/or include a computing device such as a personal computer, a server computer, a programmable logic controller (PLC), a microcontroller, and so on. The controller 109 may include one or more processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like.

Although not illustrated, the controller 109 may include a data storage device (e.g., one or more disk drives and/or solid state drives), a main memory, a static memory, a network interface, and/or other components. The controller 109 may execute instructions to perform any one or more of the methodologies and/or embodiments described herein. The instructions may be stored on a computer readable storage medium, which may include the main memory, static memory, secondary storage and/or processing device (during execution of the instructions). For example, the controller 109 may execute the instructions to activate one or more RF antennas 129 that are located within the different storage locations, the factory interface 91, the load lock or stations 104a, 104b, the transfer chamber 106, and/or any of the processor chambers 107. The controller 109 may then receive return RF signals generated by SAW sensor assemblies on the sensor wafer 110, and may analyze the received RF signals. Each of the SAW sensor assemblies may be configured to measure a particular environmental property, such as pressure, temperature, plasma power, and so on, and to output an RF signal indicative of a measurement of the particular environmental property. Additionally, multiple different SAW sensor assemblies on a sensor wafer may be configured to measure different environmental properties. The controller 109 may receive the RF signals and determine the measurement values (e.g., of amplitude, phase, frequency and/or time-delay) for the environmental property (or properties) that was measured based on the received RF signals.

In some embodiments, a single sensor wafer 110 includes multiple SAW sensor assemblies that are tuned to different frequencies and/or that are configured to perform different modulation of signals (e.g., by performing a phase shift). Each SAW sensor may be associated with a particular modulation and/or frequency. The different frequencies and/or modulations of the various received RF signals may be used by the controller 109 to uniquely identify the specific SAW sensors that generated the respective RF signals. Thus, the sensor wafer may include many different SAW sensors, and the controller 109 can uniquely determine which SAW sensor generated each received RF signal based on a unique fingerprint of that RF signal. This enables the controller 109 to determine an environmental profile across the sensor wafer 110 (e.g., local pressures and/or temperatures across the sensor wafer 110).

Figure 2:
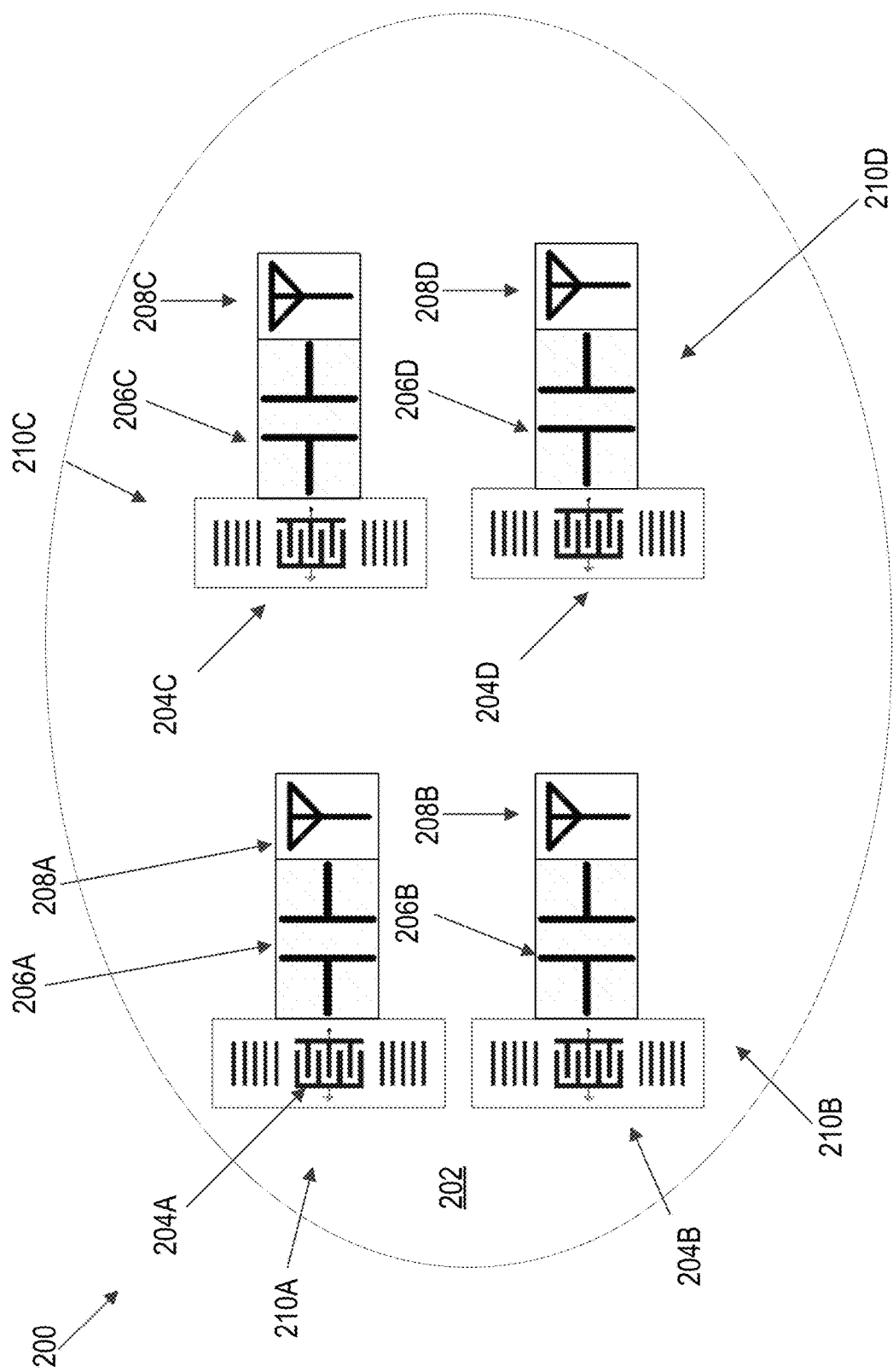
FIG. 2 is a top, perspective view of a sensor device including integrated SAW sensor assemblies, according to aspects of the disclosure.

FIG. 2 is a top, perspective view of a sensor device 200 (e.g., a sensor wafer) including integrated SAW sensor assemblies 210, according to aspects of the disclosure. The sensor device 200 includes a base substrate 202 and one or more SAW sensor assemblies 210A-D integrated into a surface of the base substrate 202. The SAW sensor assemblies 210A-D may each include an RF antenna 208A-D, matching circuitry 206A-D, and/or a SAW sensor 204A-D that are part of an integrated device. Alternatively, one or more of the SAW sensor assemblies 210A-D may include integrated components of a SAW sensor 204A-D connected to a discrete RF antenna and separate discrete matching circuitry, may include an integrated SAW sensor 204A-D and matching circuitry 206A-D connected to a separate discrete antenna, and/or may include an integrated SAW sensor 204A-D and antenna 208A-D connected to a separate discrete matching circuitry. In some embodiments, a sensor wafer has at least a layer of a piezoelectric material and includes multiple integrated SAW sensors 204A-D formed thereon, and that optionally includes one or more integrated antenna 208A-D and/or integrated matching circuitry 206A-D disposed thereon. These components are described in greater detail below with reference to FIGS. 3A-B.

As shown in FIG. 2, the base substrate 202 can be a disk shaped structure comprising a flat surface (e.g., a wafer). In other embodiments, the base substrate 202 may be formed into other flat shapes that can be used for transporting, depositing, and processing by a processing system (e.g., processing system 100 of FIG. 1). The base substrate 202 may be made of a conventional wafer base substrate such as silicon and can include or be partially or fully covered by a piezoelectric material, such as $LiNbO_3$, $LiTaO_3$, or $La_3Ga_5SiO_{14}$. In some embodiments, the base substrate may be made entirely of a piezoelectric material without a conventional wafer base substrate (e.g. silicon). In some embodiments the base substrate my include a piezoelectric substrate the includes or is composed of the piezoelectric material.

As shown in FIG. 2, the sensor device 200 includes multiple SAW sensor assemblies 210A-D integrated into and/or deposited onto the surface of the base substrate 202. The sensor device 200 may include one or more SAW sensor assemblies 210A-D. While four sensor assemblies 210A-D are shown as an example, more or fewer sensor assemblies may be included in sensor device 200. The SAW sensors assemblies 210 may be arranged in a sensor array with each integrated SAW sensor assembly 210 measuring an environmental condition of a different location on the base substrate 202. In some embodiments, each SAW sensor assembly is formed on a common piezoelectric substrate or other substrate with a piezoelectric layer formed thereon (e.g., on the same wafer). Alternatively, one or more of the SAW sensor assemblies may have been formed on a separate piezoelectric substrate or substrate with a piezoelectric layer to form a discrete sensor assembly (e.g., may have been formed on a separate piezoelectric substrate along with other SAW sensor assemblies, and then diced and packaged to form the discrete SAW sensor assemblies). The discrete sensor assembly may then be mounted onto the base substrate 202. In such embodiments, the base substrate 202 may or may not be a piezoelectric material. Each SAW sensor assembly 210A-D can be attached to or disposed at a different location on the base substrate 202.

As shown in FIG. 2, the SAW sensor assemblies 210A-D each include an RF antenna 208A-D, matching circuitry 206A-D, and a SAW sensor 204A-D. The RF antenna 208A-D, the matching circuitry 206A-D, and the SAW sensor 204A-D may each include planar conductors. For example, the RF antenna 208A-D, the matching circuitry 206A-D, and the SAW sensor 204A-D may each be formed by depositing a single conducting layer for each conductive element (e.g., one layer for the IDT(s) and/or reflectors, one layer for the antenna, and one layer for the matching network). In some embodiments, the RF antenna 208A-D, the matching circuitry 206A-D, and the SAW sensor 204A-D (e.g., including one or more IDT and/or one or more reflectors) may form a single conducting layer, where depositing each element may be performed together in a single lithography step. The RF antenna 208A-D, the matching circuitry 206A-D, and/or the SAW sensor 204A-D of a single SAW sensor assembly 120A-D may be integrated with one another on the base substrate 202 (or on a separate piezoelectric substrate or material). Additionally, in some embodiments some or all of the SAW sensor assemblies 120A-D (including their SAW sensors, matching networks and antennas) are integrated together on the base substrate 202. The RF antenna 208A-D, the matching circuitry 206A-D, and the SAW sensor 204A-D may include various materials and configurations as discussed in other embodiments herein.

In some embodiments, the sensor device 200 may include a protective coating or layer disposed above one or more of the SAW sensor assemblies 210. The protective coating may include a dielectric material, which may have a high temperature resistance (e.g. 300-1000 Degrees Celsius) Examples of dielectric coatings that may be used include $Al_2O_3$, AlN, $Y_2O_3$, $Y_3Al_5O_{12}$, yttrium-based oxides, fluorides and/or oxyfluorides, and so on.

In some embodiments, the sensor device 200 includes a layer on the back side of the base substrate 202 opposite the SAW sensor assemblies 210. This layer on the back side may include or be a metal layer. The metal layer may be used to minimize interference from other signals (e.g., RF antennas 129 of FIG. 1 in other chambers) and may optionally provide increased support for holding the sensor device 200 by a chuck (e.g., an electrostatic chuck).

In some embodiments, the sensor device 200 may include a shielding structure disposed over an area of the base substrate above the SAW sensor 204, or a portion thereof. The shielding structure may include a recess above the area of the base substrate 202 to allow propagation of SAWs across a surface of the base substrate 202. The shielding structure may include a material with high temperature resistance and/or a high pressure resistance. In some embodiments, the material is metal, such as stainless steel, aluminum or an aluminum alloy. In some embodiments, the material is a ceramic, which may be a dielectric material. In some embodiments, the shielding structure is disposed across a greater portion of the base substrate 202. For example, the shielding structure may include a cover that completely encloses the sensor device 200.

In some embodiments, as shown in FIG. 2, the SAW sensor assemblies 210A-D may be disposed on the same side (e.g., front side) of the substrate. However, in other embodiments, the SAW sensor assemblies may 210A-D be disposed on both the front side and the back side of the substrate. For example, a first set of SAW sensor assemblies (which may operate at a first resonant frequency) may be disposed on a first side of the base substrate 202 and a second set of SAW sensors (which may operate at a second resonant frequency) may be disposed on a second side of the base substrate 202.

In some embodiments, the SAW sensor assemblies 210A-D may be located in close proximity to one another. SAW sensor assemblies may be co-located or share elements (e.g., an RF antenna 208A, matching circuitry 206A, and/or SAW sensor of a first SAW sensor assembly may be a part of another SAW sensor assembly) in some embodiments. In one embodiment, a first IDT may be adjacent to a second IDT. The first IDT may generate a SAW that is reflected by reflectors back to the second IDT. In one embodiment, SAW reflectors of a SAW sensor (e.g. 204A) may be used to reflect SAWs from a second SAW sensor assembly. In another example, two SAW sensor assemblies may include SAW sensors that may generate and propagate SAWs across the same region of the substrate 202. In another example, the SAW sensor assemblies may be formed such that the IDT of the SAW sensors 204 are disposed adjacent to each other and propagate SAWs in two different directions.

Figure 3A:
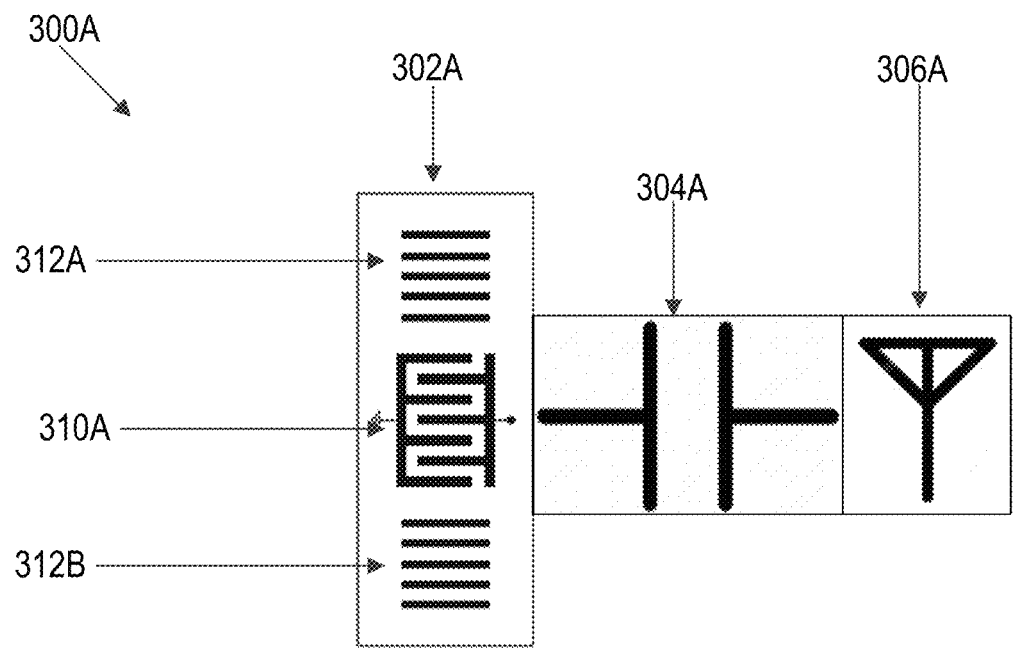
FIGS. 3A-B depict various embodiments of SAW sensor assemblies, according to aspects of the disclosure.
Figure 3B:
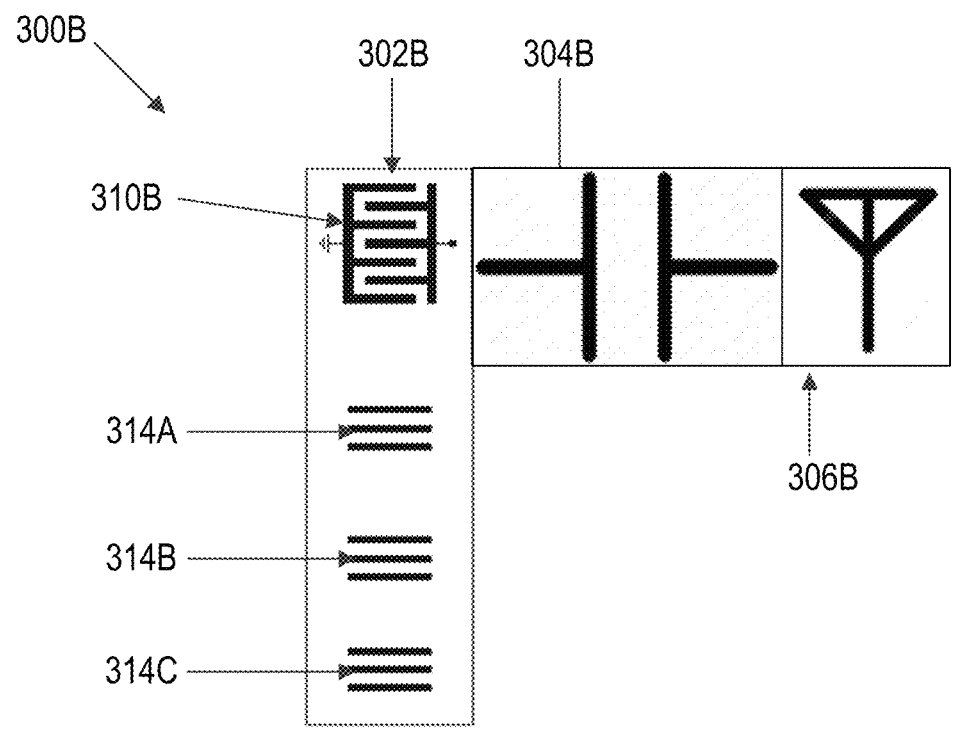

FIGS. 3A-B depict various embodiments of SAW sensor assemblies 300A-B, according to aspects of the disclosure. The SAW sensor assemblies 300 may include an RF antenna 306A-B, matching circuitry 304A-B, and a SAW sensor 302A-B. The SAW sensor assemblies may be used, for example, on sensor device 200 of FIG. 2.

The RF antenna 306A-B may include a planar conductor or multiple conducting layers coupled together to receive and/or transmit RF signals. As used herein, components that are coupled together may be directly coupled or indirectly coupled. For example, an IDT that is coupled to an antenna may be directly coupled to the antenna or may be indirectly coupled to the antenna via a matching network that is between the IDT and the antenna. The RF antenna 306A-B may operate as a filter associated with a specific RF range. The RF antenna 306A-B may include a resonator antenna (e.g., such as a dielectric resonator antenna), a fractal antenna, or some other type of antenna. RF antenna 306A-B may be a flat structure or formed to be generally flat or flush against the surface of a substrate (e.g., may be a planar conductor). The matching circuitry 304A-B is coupled to the RF antenna 306A-B and the SAW sensor 302A-B. The matching circuitry 304A-B may include combinations of circuitry components such as resistors, capacitors, and/or inductors to match the impedance and/or load of the RF antenna 306A-B. The matching circuitry 304A-B may be designed to minimize signal reflections between the RF antenna 306A-B and the SAW sensor 302A-B in embodiments. Each SAW sensor 302A-B is coupled to a respective RF antenna 306A-B through a respective matching circuitry 304A-B. As shown in FIGS. 3A-B, the SAW sensor 302A-B may include an interdigitated transducer (IDT) 310A-B. The IDT 310A-B includes two comb-shaped electrodes that are interdigitated with each other. The IDT 310A-B may be disposed on a piezoelectric material (e.g., base substrate 202 of FIG. 2). The IDT receives an incoming signal (e.g., alternating current (AC) signal) from the matching circuitry 304 and generates an electric field in the gaps between the conducting digits of the electrodes based on the signal. This electric field generates a SAW on the surface of the piezoelectric material.

As shown in FIG. 3A, the SAW sensor 302A may include SAW reflectors 312A-B. The SAW generated by the IDT 310 propagates along the surface of the piezoelectric material to the SAW reflectors 312A-B. The SAW reflectors 312A-B may include strips of conducting material (e.g., planar conductors) designed to reflect a part of the incoming SAW generated by the IDT 310A. These reflected portions of the SAW may be reflected back to the IDT 310A. The IDT 310A may combine the reflected SAWs as reflected by multiple reflectors 312A-B together to generate an oscillating electric potential. The oscillating electric potential may be sent to the RF antenna 306. The RF antenna 306 outputs an outgoing RF signal associated with the oscillating electric potential, which may be received by an RF signal receiving device (e.g., RF antenna 129 of FIG. 1). The oscillating electric potential generated by the IDT 310A includes information indicative of an environmental condition of an environment disposed between the IDT 310 and the SAW reflectors 312. The environmental condition may be indicated by a change in frequency of the RF signal transmitted to the SAW sensor assembly 300 and the RF signal received in return. The signal received in return may include information indicative of an environmental condition. For example, for a given temperature or pressure the length of the piezoelectric material will strength or compress resulting in a change in pitch, phase, and overall delay of the signal that may be calibrated to a specified temperature or pressure. In some embodiments, the reflectors may be spatially arranged and calibrated such that a change in frequency between the RF signal is associated with a change in the environmental condition (e.g., a change in temperature or pressure).

In some embodiments the SAW reflectors 312A-B may be disposed on one or multiple sides of the IDT 310A, as shown in FIG. 3A. The SAW reflectors may vary in distance between each other as well as in thickness in some embodiments. Alternatively, the SAW reflectors may have uniform thickness and/or spacing.

As shown in FIG. 3B, SAW sensor 302B includes a series of delay lines 314A-C. The SAW generated by the IDT 310 propagates along the surface of the piezoelectric material to the delay lines 314A-C. The delay lines 314A-C may include strips of conducting material (e.g., planar conductors) designed to reflect and/or delay the SAW generated by the IDT 310. The delayed and reflected SAWs return to the IDT 310 and are combined together. The relative delay of the reflected SAW constructively and destructively interfere with each other which results in an oscillating electric potential that is indicative of a measured environmental condition. The oscillating electric potential may be sent to the RF antenna 306 and transmitted to another device (e.g., RF antenna 129 of FIG. 1). The oscillating electric potential includes information indicative of an environmental condition of an environment between the IDT 310 and the delay lines 314. The environmental condition may be indicated by a change in frequency of the return RF signal transmitted by the RF antenna 306 or a relative delay of the reflected SAWs. In some embodiments, the reflectors 314A-C may be spatially arranged and calibrated such that a relative delay between a first set of delay lines (e.g., 314A) and a second set of delay lines (e.g., 314B) is associated with a measured environmental condition such as temperature or pressure.

In some embodiments, the SAW sensors 302A-B include a second IDT (not pictured). The first IDT 310A-B may take an incoming electric signal and generate a SAW associated with the incoming signal. The SAW may travel across the piezoelectric material and be received by the second IDT. In some embodiments, the SAW may pass through conducting elements (e.g., delay lines 314) on the surface of the piezoelectric material before reaching the second IDT. The second IDT may generate an oscillating electric potential associated with the received SAW. The oscillating electric potential may be transmitted through matching circuitry connected to the second IDT to an RF antenna attached to that matching circuitry. The changes between the first oscillating electric potential based on the received RF signal and a second oscillating electric potential generated by the IDT based on the received SAW may be indicative of a measured environmental condition. In some embodiments, multiple IDTs may share a common RF antenna and/or matching network.

In some embodiments, the RF antenna 306A-B, the matching circuitry, 304A-B, and the SAW sensor 302A-B including the IDT 310A-B are all integrated together on a common piezoelectric material. As discussed further in other embodiments, the SAW sensor assembly 300A-B may be fully integrated into a piezoelectric material This may enable the entire SAW sensor assembly 300A-B to be fabricated together on a substrate (e.g. a wafer) instead of pieces together in multiple assembly steps and separate component fabrication steps. Fabricating a sensor device having all of the components in one integrated device enables the use of a smaller sensor device that in turn can reduce manufacturing cost, time, and reduce the required number of manufacturing steps. Additionally, fabricating a single device enables the components to be created to be compatible with each. Also, the inefficiencies of matching component specification would be eliminated.

FIG. 4 is a flow chart of a method 400 for fabricating a SAW sensor assembly, according to aspects of the disclosure. The method 400 may be implemented to manufacture a sensor device (e.g., sensor assembly 110 of FIG. 1) in embodiments.

With reference to FIG. 4, at block 410, a conductive structure is formed on a substrate having at least a layer of a piezoelectric material disposed thereon, forming an RF antenna on the piezoelectric material. The RF antenna may correspond to any of the aforementioned RF antennas. The piezoelectric material may be any of the aforementioned piezoelectric materials. Forming the first conductive structure may include performing a photoresist deposition operation to deposit a photoresist on the piezoelectric material, performing a patterning operation (e.g., with a lithography device) to cure a selective portion of the photoresist, and performing an etch operation (e.g., in an etch chamber) to etch away either the cured portion or the uncured portion of the photoresist. A deposition process (e.g., atomic layer deposition, physical vapor deposition, chemical vapor deposition, etc.) may then be performed (e.g., in a deposition chamber) to deposit a conductive layer (e.g., a metal layer) on the piezoelectric material and the photoresist formed thereon. A selective etch process may then be performed (e.g., in an etch chamber) to remove the photoresist and the conductive material formed thereon, leaving behind the first conductive structure.

At block 420, a second conductive structure is formed on the piezoelectric structure, forming matching circuitry that may have an electrical connection to the first conductive structure that constitutes the RF antenna (e.g., that may be coupled to the RF antenna). The matching circuitry may correspond to the aforementioned matching circuitry. Forming the second conductive structure may include performing a photoresist deposition operation to deposit a photoresist on the piezoelectric material, performing a patterning operation (e.g., with a lithography device) to cure a selective portion of the photoresist, and performing an etch operation (e.g., in an etch chamber) to etch away either the cured portion or the uncured portion of the photoresist. A deposition process (e.g., atomic layer deposition, physical vapor deposition, chemical vapor deposition, etc.) may then be performed (e.g., in a deposition chamber) to deposit a conductive layer (e.g., a metal layer) on the piezoelectric material and the photoresist formed thereon. A selective etch process may then be performed (e.g., in an etch chamber) to remove the photoresist and the conductive material formed thereon, leaving behind the second conductive structure. The second conductive structure may be formed at the same time as the first conductive structure. Thus, a series of operations (e.g., photoresist deposition, lithography, etch, metal deposition, etch, etc. processes) may be performed to form both the first conductive structure and the second conductive structure at the same time or in parallel.

At block 430, a third conductive structure is formed on the piezoelectric structure, forming an interdigitated transducer (IDT) on the piezoelectric material. The IDT may be coupled to the RF antenna and the matching circuitry. The IDT may include features and configurations of IDTs disclosed in other embodiments of the present disclosure (e.g., IDT 310 of FIG. 3). Forming the third conductive structure may include performing a photoresist deposition operation to deposit a photoresist on the piezoelectric material, performing a patterning operation (e.g., with a lithography device) to cure a selective portion of the photoresist, and performing an etch operation (e.g., in an etch chamber) to etch away either the cured portion or the uncured portion of the photoresist. A deposition process (e.g., atomic layer deposition, physical vapor deposition, chemical vapor deposition, etc.) may then be performed (e.g., in a deposition chamber) to deposit a conductive layer (e.g., a metal layer) on the piezoelectric material and the photoresist formed thereon. A selective etch process may then be performed (e.g., in an etch chamber) to remove the photoresist and the conductive material formed thereon, leaving behind the third conductive structure. The third conductive structure may be formed at the same time as the first and/or second conductive structures. Thus, a series of operations (e.g., photoresist deposition, lithography, etch, metal deposition, etch, etc. processes) may be performed to form the first conductive structure, second conductive structure and third conductive structure at the same time or in parallel.

At block 440, a fourth conductive structure is formed on the piezoelectric material, forming at least one of a a) one or more SAW reflectors or b) a second IDT electrode. The SAW reflectors and second IDT may be separated from the IDT by a span of the piezoelectric material, across which SAWs may propagate. This may cause the second IDT and/or reflectors to be communicatively coupled to the first IDT via the SAWs. The SAW reflectors may include features and configuration of SAW reflectors disclosed elsewhere in the present disclosure (e.g., SAW reflectors 312 of FIG. 3A and FIG. 3B). The second IDT may include features and configuration of IDTs disclosed elsewhere in the present disclosure (e.g., IDT 310 of FIG. 3A and FIG. 3B). Forming the fourth conductive structure may include performing a photoresist deposition operation to deposit a photoresist on the piezoelectric material, performing a patterning operation (e.g., with a lithography device) to cure a selective portion of the photoresist, and performing an etch operation (e.g., in an etch chamber) to etch away either the cured portion or the uncured portion of the photoresist. A deposition process (e.g., atomic layer deposition, physical vapor deposition, chemical vapor deposition, etc.) may then be performed (e.g., in a deposition chamber) to deposit a conductive layer (e.g., a metal layer) on the piezoelectric material and the photoresist formed thereon. A selective etch process may then be performed (e.g., in an etch chamber) to remove the photoresist and the conductive material formed thereon, leaving behind the fourth conductive structure. The fourth conductive structure may be formed at the same time as the first, second and/or third conductive structures. Thus, a series of operations (e.g., photoresist deposition, lithography, etch, metal deposition, etch, etc. processes) may be performed to form the first conductive structure, second conductive structure, third conductive structure and fourth conductive structure at the same time or in parallel.

At block 450, a fifth conductive structure is optionally formed on the piezoelectric material, forming one or more waveguides between IDTs. Forming the fifth conductive structure may include performing a photoresist deposition operation to deposit a photoresist on the piezoelectric material, performing a patterning operation (e.g., with a lithography device) to cure a selective portion of the photoresist, and performing an etch operation (e.g., in an etch chamber) to etch away either the cured portion or the uncured portion of the photoresist. A deposition process (e.g., atomic layer deposition, physical vapor deposition, chemical vapor deposition, etc.) may then be performed (e.g., in a deposition chamber) to deposit a conductive layer (e.g., a metal layer) on the piezoelectric material and the photoresist formed thereon. A selective etch process may then be performed (e.g., in an etch chamber) to remove the photoresist and the conductive material formed thereon, leaving behind the fifth conductive structure. The fifth conductive structure may be formed at the same time as the first, second, third and/or fourth conductive structures. Thus, a series of operations (e.g., photoresist deposition, lithography, etch, metal deposition, etch, etc. processes) may be performed to form the first conductive structure, second conductive structure, third conductive structure, fourth conductive structure and fifth conductive structure at the same time or in parallel.

In some embodiments, the conductive structures forming the RF antenna, the matching circuitry, the IDTs, the SAW reflectors and/or the waveguides form a single conducting layer. The operations at block 410, 420, 430, 440 and/or 450 may be performed together such that each conductive structure is deposited together. Alternatively, one or more of the layers may be formed separately.

In some embodiments, method 400 may further include depositing a protective coating on the RF antenna and/or the matching circuitry. The protective coating may include a dielectric material, which may be plasma resistant, have a high temperature resistance and/or have a high pressure resistance. Examples of dielectric coatings that may be used include $Al_2O_3$, AlN, $Y_2O_3$, $Y_3Al_5O_{12}$, yttrium-based oxides, fluorides and/or oxyfluorides, and so on.

In some embodiments, depositing the protective layers or protective coatings may be performed using atomic layer deposition, chemical vapor deposition, physical vapor deposition, or plasma enhanced versions thereof.

Figure 5A:
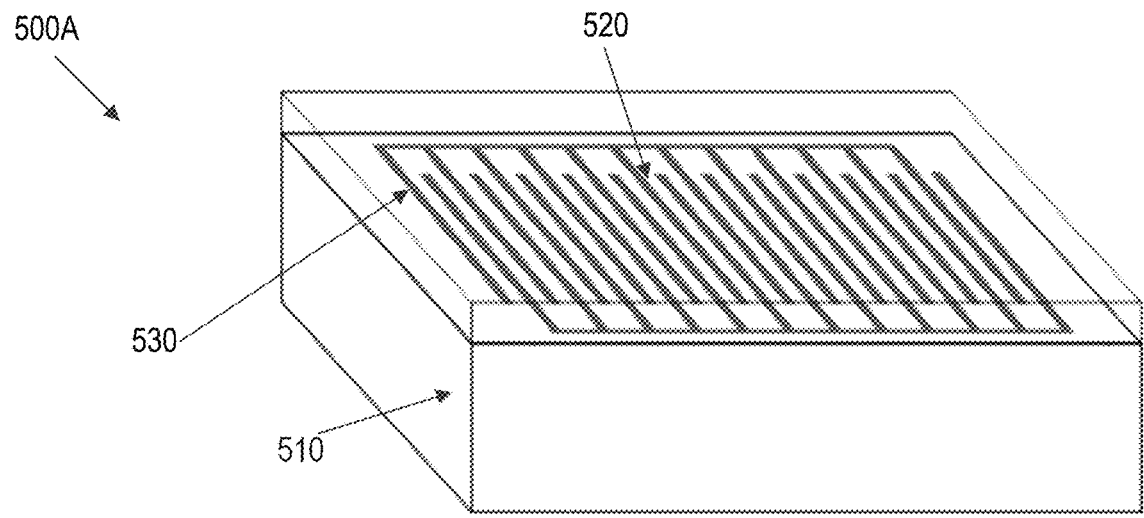
FIGS. 5A-B are top, perspective views of various embodiments of SAW sensors with dielectric coatings, according to aspects of the disclosure.
Figure 5B:
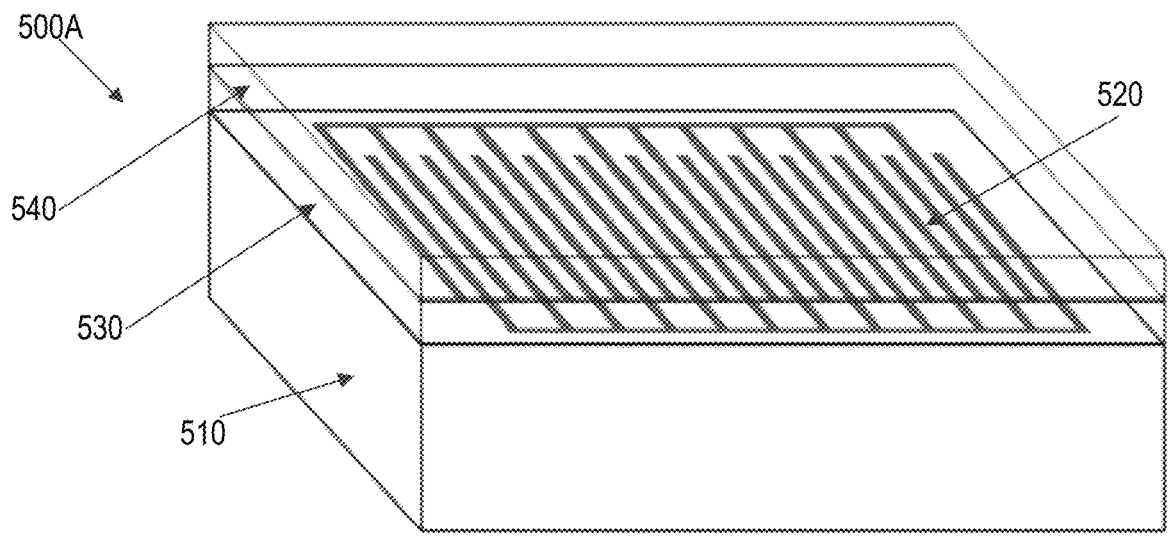

FIGS. 5A-B are top, perspective views of various embodiments of SAW sensors 500 with dielectric coatings 530, 540 disposed thereon, according to aspects of the disclosure. The SAW sensor 500A-B includes an IDT 520 having two comb-shaped interdigitated electrodes disposed on a base substrate 510 having at least a layer of a piezoelectric material. The SAW sensor further includes a dielectric coating 530 disposed on top of the IDT 520 and base substrate 510. The SAW sensor 500A-B may additionally include one or more additional IDTs and/or reflectors spaced apart from the IDT 520 on the base substrate 510. The dielectric coating 530 may additionally coat the additional IDT(s) and/or reflectors and/or the area of the base substrate 510 between the IDT and the additional IDT(s) and/or reflectors. In embodiments in which an integrated SAW sensor assembly also includes an RF antenna and a matching network, the RF antenna and the matching network may also be coated by the dielectric coating 530.

In some embodiments, the IDT 520 receives an electrical signal (e.g., an alternating current signal) and generates a SAW across the surface of the piezoelectric material. The generated SAW includes a propagation velocity and a resonant frequency. The resonant frequency of the SAW sensor can be adjusted by applying dielectric coating 530. The dielectric coating 530 may adjust the propagation velocity of the SAW resulting in a reduced resonant frequency. The dielectric coating 530 may include a thin uniform dielectric layer. Examples of dielectric coatings that may be used include $Al_2O_3$, AlN, $Y_2O_3$, $Y_3Al_5O_{12}$, yttrium-based oxides, fluorides and/or oxyfluorides, and so on.

In some embodiments, a target resonant frequency can be reached by determining a base resonant frequency of the SAW sensor and determining a thickness and/or material to coat the surface of the SAW sensor associated with a first frequency shift such that the base frequency with the applied frequency shift results in the target resonant frequency. In some embodiments, for example, as shown in in FIG. 5A, a single dielectric layer (or dielectric layer of a first material and/or thickness) may be applied to the SAW sensor. However in other embodiments, for example, as shown in FIG. 5B multiple dielectric layers of the same or different materials and/or thicknesses may be applied to tune the resonant frequency of the IDT 520. For example, as shown dielectric coating 530 is a first layer and dielectric coating 540 is a second layer. Alternatively, a single dielectric coating (with one layer) may be used, which may have a different thickness and/or material than the dielectric coating 530 used in FIG. 5A.

Figure 8:
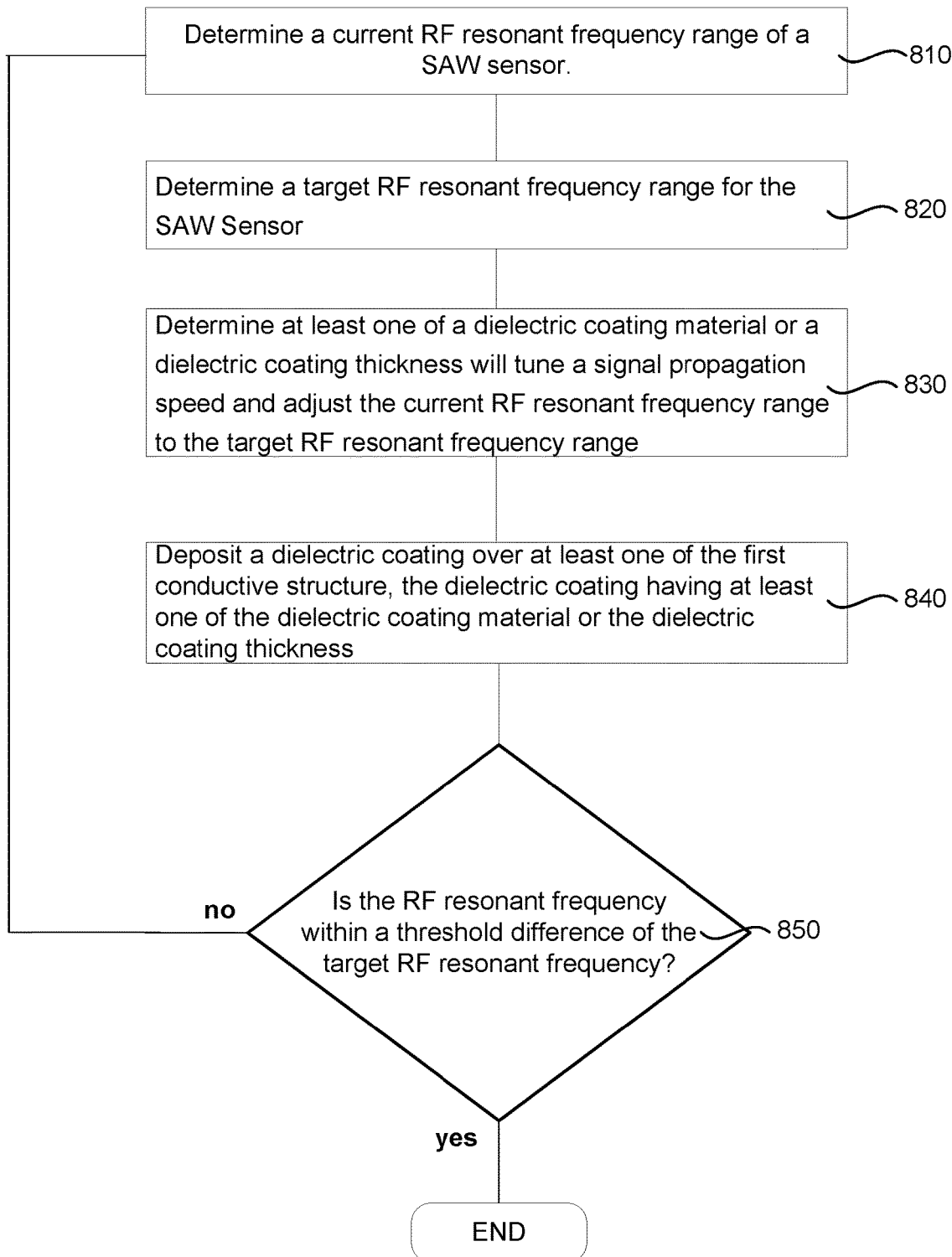
FIG. 8 is a flow chart of a method for fabricating a SAW sensor assembly, according to aspects of the disclosure.

In some embodiments, SAW sensor 500A-B may be fabricated as according to method 400 of FIG. 4 and/or method 800 of FIG. 8.

In some embodiments, sensor data processing and analysis, image processing algorithms, machine learning (ML) algorithms that generate one or more trained machine learning models, deep ML algorithms, and/or other signal processing algorithms for analyzing SAW sensor data can be used to determine resonant frequency shifts of a SAW sensor as a result of applying any number of dielectric coatings of various materials and thicknesses on top of an IDT of a SAW sensor. These models, analysis, and/or algorithms can be used to calculate, predict, and evaluate combinations of dielectric materials and thicknesses and resulting resonant frequency shifts for a given SAW sensor. Additionally, or alternatively, such techniques may be used with SAW sensor data to design multiple SAW sensors that can operate together in close proximity without signals of such SAW sensors being confused. In some embodiments, training data to train a ML model may be obtained by imaging, using a scanning device or other type of sensor or camera to measure resonant frequency shifts of SAW sensors that have previously been coated by a dielectric material of a specified material and thickness.

One type of machine learning model that may be used is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In an image recognition application, for example, the raw input may be a matrix of pixels; the first representational layer may abstract the pixels and encode edges; the second layer may compose and encode arrangements of edges; the third layer may encode higher level shapes (e.g., teeth, lips, gums, etc.); and the fourth layer may recognize that the image contains a face or define a bounding box around teeth in the image. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, a neural network is trained using a training dataset that includes multiple data points, where each data point includes a SAW sensor configuration (e.g., including an IDT with a particular finger arrangement and/or a particular arrangement of reflectors) and may include a particular piezoelectric material and/or a dielectric coating having a known material and/or thickness). Each training data point may additionally include or be associated with a SAW attribute, such as a SAW frequency, phase, time delay, etc. The neural network may be trained using the training dataset to receive an input of a SAW sensor configuration and target SAW attribute and to output a suggestion of a dielectric coating having a particular material and/or thickness that, when deposited over the SAW sensor, will cause the SAW sensor to generate SAWs that have the target SAW attribute.

Figure 6:
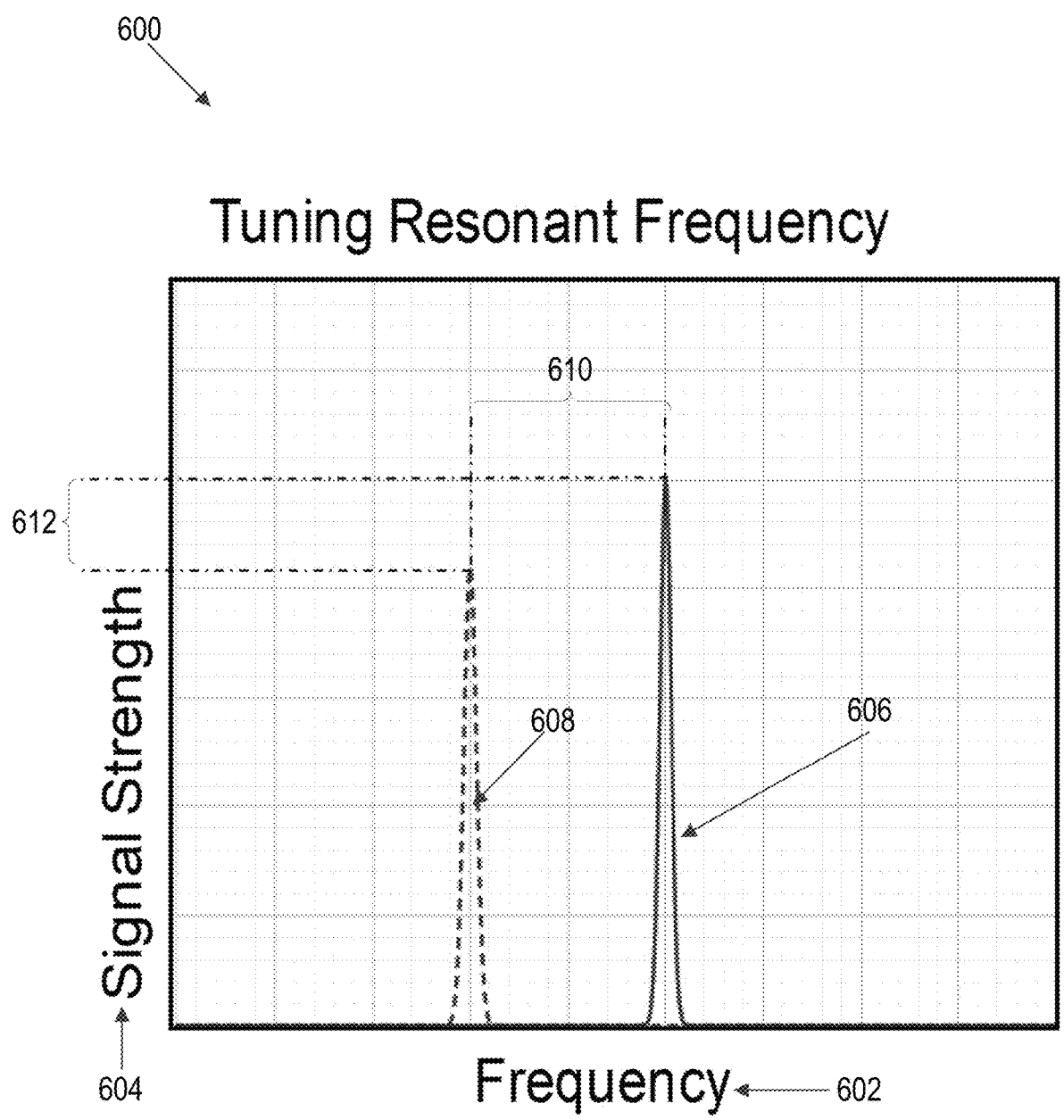
FIG. 6 is a graph depicting a frequency shift in base resonant frequency of an SAW sensor, according to aspects of the disclosure.

FIG. 6 is a graph 600 depicting a frequency shift 610 in a base resonant frequency of an SAW sensor, according to aspects of the disclosure. A first peak 606 shows an IDT without a dielectric coating having a first resonant frequency. The second peak 608 shows an IDT with a dielectric coating having a second resonant frequency. The distance between the peaks represents a frequency shift 610 which is a result of applying the dielectric coating. The dielectric coating can be used to tune the resonant frequency. As the thickness of the dielectric coating increases the frequency shift 610 increases. In some embodiments, the dielectric coating may also protect the SAW sensor from extreme environmental conditions (e.g., from a plasma environment, from a corrosive chemical environment, and so on). As shown in FIG. 6, there is a signal strength reduction 612 resulting from the dielectric coating. The dielectric coating may also prevent the SAW sensor from overexposure and signal saturation from the environment in embodiments.

Figure 7:
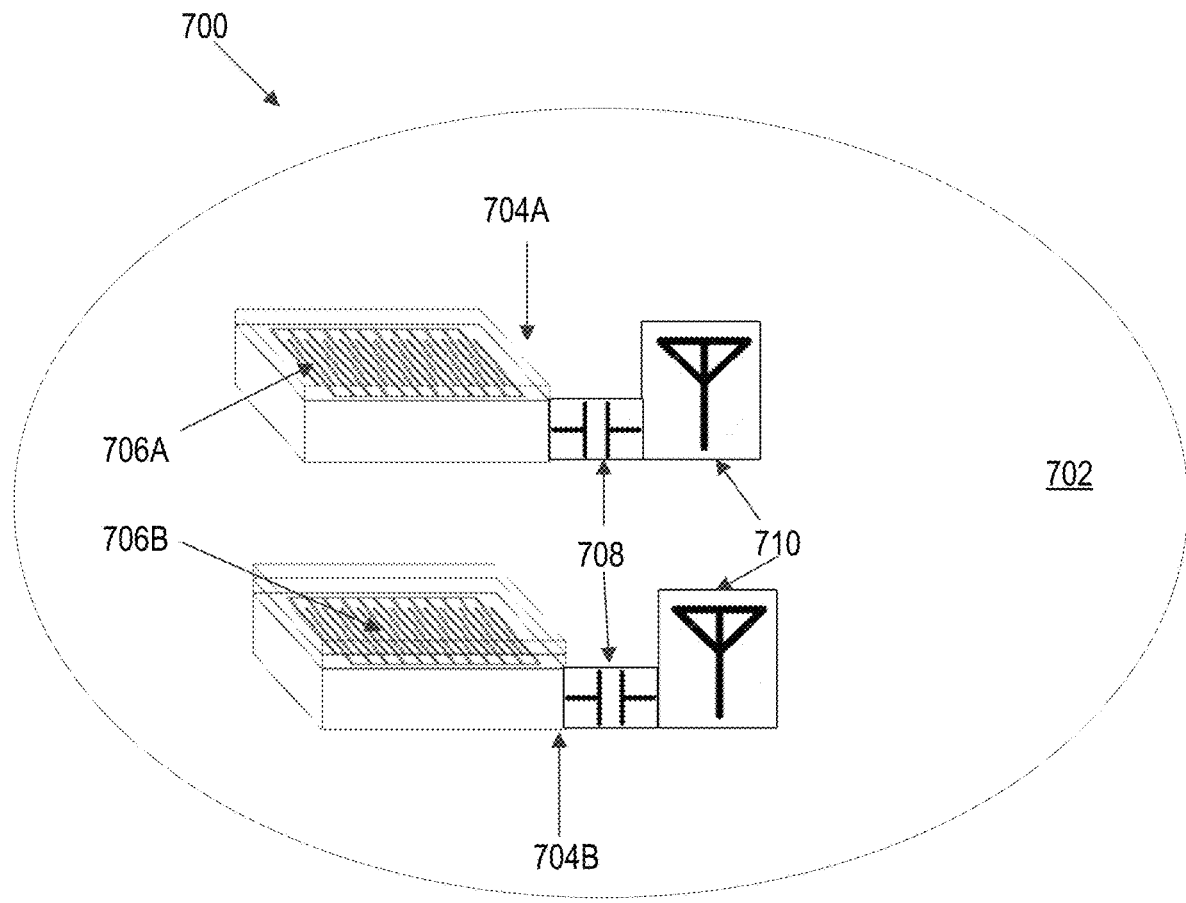
FIG. 7 is a top perspective view of a sensor device, according to aspects of the disclosure

FIG. 7 is a top perspective view of a sensor device 700, according to aspects of the disclosure. The sensor device 700 has a base substrate 702 and includes SAW sensor assemblies 704A-B disposed on the base substrate 702. The SAW sensor assemblies 704A-B include RF antennas 710, matching circuitry 708, and SAW sensors 706A-B. The SAW sensor assemblies 704A-B including the RF antenna 710, matching circuitry 708, and SAW sensors 706A-B may include features and configurations of SAW sensors disclosed elsewhere herein (e.g., base substrate 202 and SAW sensor assemblies 210 of FIG. 2 and 300 of FIG. 3).

As shown in FIG. 7, the SAW sensors 706A-706B may be disposed on a piezoelectric material of the base substrate 702, which may be attached to or deposited on a base substrate 702. For example, a piezoelectric substrates of the SAW sensors 706A-B may be attached to a silicon wafer. In other embodiments, the SAW sensor assemblies may be fully integrated into the base substrate 702. For example, the base substrate 702 may include a common piezoelectric material and the RF antenna 710, the matching circuitry 708, and the SAW sensors 706A-B of one or more SAW sensor assemblies 704A-B may be integrated with the each other on the common piezoelectric material. Alternatively, one or more of the RF antenna 710 or matching circuitry 708 may be discrete devices that are not integrated into the base substrate 702.

As shown in FIG. 7, SAW sensor 706A-B may each include an IDT disposed on a piezoelectric material and a dielectric coating covering the IDT. In some embodiments, the dielectric coating of each SAW sensor 706A-B assembly may include the same thickness and material. In other embodiments the thickness and/or material of the dielectric coating may be unique for each SAW sensor assembly 704. Unique resonant frequencies of various SAW sensor assemblies can be used to measure an environmental condition and map the measurement to a particular SAW sensor and thus location on the base substrate 702.

In some embodiments, the dielectric coating may cover a portion of the SAW sensor assembly 704 having the SAW sensor 706A-B. However, in other embodiments, the dielectric coating may cover the entirety of each SAW sensor assembly 704 including the RF antenna 710, and the matching circuitry 708.

In some embodiments, each sensor assembly may include SAW sensor assemblies 704 with SAW sensors 706A-B having the same base resonant frequency. The SAW sensors 706A-B may be tuned to generate SAWs with different acoustic frequencies by generating different resonant frequencies shifts by applying a dielectric coating with a different thickness and/or material to each SAW sensor 7086A-B706A-B. For example, a first saw sensor 706A may have a first dielectric coating with a first thickness and a second SAW sensor 706B may have a second dielectric coating with a second thickness.

In some embodiments, combinations of SAW sensor assemblies with and/or without dielectric coatings (not pictured) can be combined on the same base substrate 702 as SAW sensor assemblies 704 with dielectric coatings.

FIG. 8 is a flow chart of a method 800 for fabricating a SAW sensor assembly, according to aspects of the disclosure.

With reference to FIG. 8, at block 810, a processing system may determine a current RF resonant frequency range of a SAW sensor. The SAW sensor may include features and configurations of SAW sensors disclosed elsewhere herein (e.g., SAW sensor 500 of FIG. 5).

At block 820, a processing system may determine a target RF resonant frequency range for the SAW sensor.

At block 830, a processing system may determine at least one of a dielectric coating material or a dielectric coating thickness that will tune a signal propagation speed and adjust the current RF resonant frequency range to the target RF resonant frequency range. In one embodiment, a SAW sensor design (and optionally a target SAW attribute) is input into a trained machine learning model, which outputs a suggestion for the dielectric coating material and/or dielectric coating thickness. In some embodiments the processing system determines a combination of dielectric materials and layers to be deposited on the SAW sensor. In some embodiments, the determined material and thickness is dependent on SAW sensor specifications (e.g., surface area, maximum thickness, etc.).

At block 840, a processing system may deposit a dielectric coating over the SAW sensor. The dielectric coating may have at least one of the dielectric coating material or the dielectric coating thickness determined at block 830.

At block 850, a processing system may determine if the resonant frequency is within a threshold difference of the target RF resonant frequency. The processing system may measure the current resonant frequency and compare the result to the target resonant frequency determined at block 820. If the resonant frequency is within the threshold difference, the method 800 may complete. However, if the resonant frequency is not within the threshold difference of the target frequency the method returns to block 810 and repeats steps of the method to determine and deposit another dielectric coating.

Figure 9C:
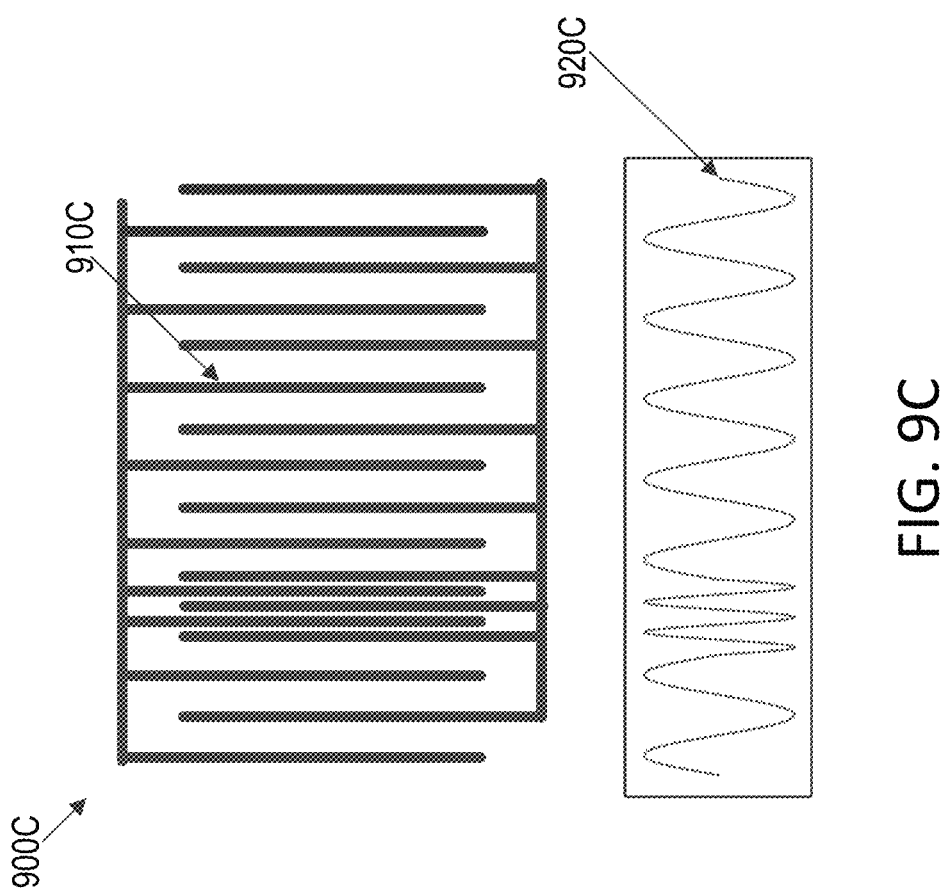

FIGS. 9A-C depict various embodiments of electrode arrangements of IDTs 900A-B of a SAW sensor, according to aspects of the disclosure. The IDTs 900A-C each include two comb-shaped electrodes having interlocking digits 910A-C disposed in an arrangement on a substrate having at least a layer of a piezoelectric material.

In some embodiments, the IDT 900A-C receives an electrical signal (e.g., an RF signal) and generates a SAW associated with the received electrical signal. In another embodiment, the IDT 900A-C receives a SAW and generates an electrical signal (e.g., an RF signal) associated with the received SAW. In either case, the arrangement of the interlocking digits 910A-C of the electrodes can generate a signal modulation within any signal that passes through the IDT 900A-C.

Embodiments of the present disclosure include various arrangements of interlocking digits 910A-C. As shown in FIG. 9A, for example, an IDT 900A may include a first arrangement of alternating interlocking digits 910A. This first arrangement may result in an unmodulated signal 920A having a particular resonant frequency and/or phase. As shown in FIG. 9B, for example, an IDT 900B may include a second arrangement of interlocking digits 910B that includes at least two digits from the same electrode arranged adjacent to each other. This arrangement may result in a modulated signal 920B. In some embodiments modulated signal 920B may include the same resonant frequency as the unmodulated signal 920A but with a phase shift or otherwise modified signal. The pitch or spacing between the interlocking fingers may also be adjusted to create a modulated signal with an adjusted or modulated frequency, as set forth in FIG. 9C.

In some embodiments, the arrangement of the interlocking digits (e.g., 910B) may result in a signal modulation that identifies the IDT (e.g., 910B). For example, the modulated signal (e.g., 920B) includes unique signal modulations (e.g., phase shifts 930) that act as identifiers to further signal processing devices (e.g., RF antenna 129 of FIG. 1). In a further example, the signal generated by the SAW sensor may include information identifying a measurable environmental condition as well as a signal modulation that identifies that SAW sensor that transmitted the signal comprising the information.

In some embodiments, the signal modulation generated by the arrangement of interlocking digits may result in a signal modulation comprising phase shifts of the original signal. For example, as shown in FIG. 9B, the arrangement of interlocking digits 910B results in a signal of the same frequency of the unmodulated signal with phase shifts 930 at various location across the signal. In some embodiments, the modulated signal includes the same frequency as the unmodulated signal.

IDTs 900A-C depicted in FIGS. 9A-C may be subsets or subsections of an IDT used in various embodiments of the present disclosure. For example, the arrangement depicted by IDT 900A may be repeated for a longer IDT. In another example, the IDT 900B depicted in FIG. 9B may include more interlocking digits than depicted and these digits may include various arrangements that result in various phase and/or frequency modulations. For example, IDT 900B may be associated with phase shifting a pulse of the signal, but when combined with other subsections (not depicted) create a signal modulation of a signal comprised of multiple modulated pulses resulting in a modulated signal. In some embodiments, combinations of arrangements depicted by IDT 900A and IDT 900B may be combined to have both phase shifting regions and regions without modulations. For example, an IDT may comprise alternating subsections that include IDT 900A and IDT 900B that result in signal modulations. Additionally, an IDT may comprise alternating subsections that include IDT 900A, IDT 900B and/or IDT 900C that result in signal modulations.

In some embodiments, the IDTs 900A-C may be a part of a SAW sensor (e.g., SAW sensor 204 of FIG. 2) of a sensor assembly (e.g., SAW sensor assembly 210 of FIG. 2) of a sensor device (e.g., sensor device 200 of FIG. 2). Various SAW sensor assemblies may be disposed across a base substrate (e.g., wafer). Each SAW sensor assembly may include a SAW sensor with an IDT having a unique arrangement of digital interlocking digits. Each SAW sensor may measure an environmental condition and return the information in a signal having a signal modulation identifying the SAW sensor assembly that transmitted the information. It can be appreciated that by having unique signal modulations, each sensor can operate within overlapping or even equivalent resonant frequency ranges and still be differentiated from other sensors. For example, a measured environmental condition can be mapped to a first region of the base substrate because the signal transmitting the information associated with the environmental condition also includes a signal modulation identifying a sensor located in the first region of the base substrate.

In some embodiments, the arrangement of interlocking digits may be combined with other embodiments of the present disclosure to identify the sensor. For example, the arrangement of interlocking digits 910 may be combined with a spatial arrangement of SAW reflectors 1004 as discussed in association with FIG. 10A and FIG. 10B. This may result in a further modulated signal that uniquely identifies a SAW sensor. In another example, the arrangement of interlocking digits 910 may be combined with the application of a dielectric coating 530 as discussed in association with FIG. 5. This may result in a signal modulation combined with a tuned frequency that uniquely identifies a SAW sensor. The combination of these techniques can increase a density of SAW sensors that can be placed together on a sensor wafer and still be uniquely identified.

Figure 10A:
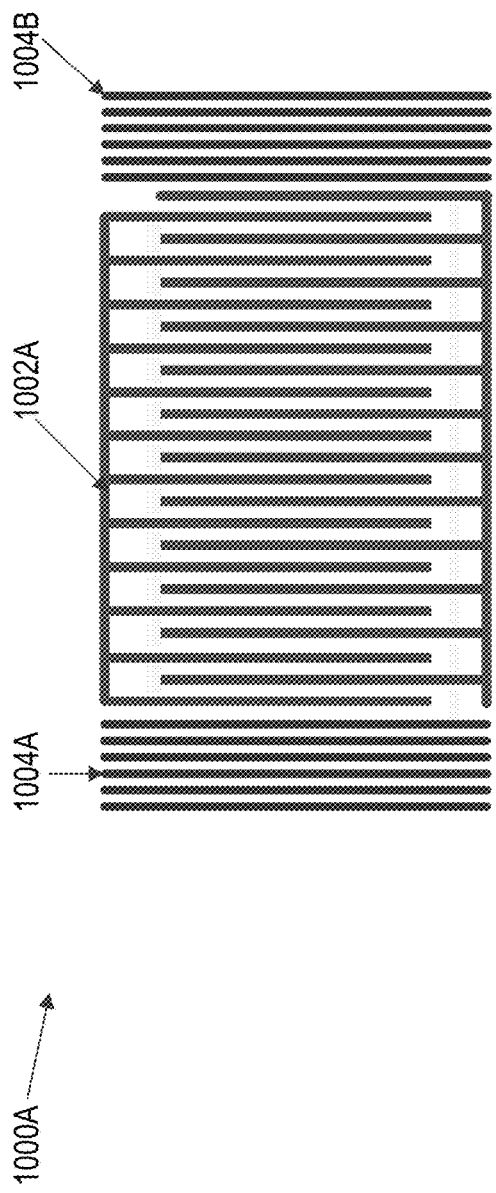
FIGS. 10A-B depict various spatial arrangements of SAW reflectors of SAW sensors, according to aspects of the present disclosure.
Figure 10B:
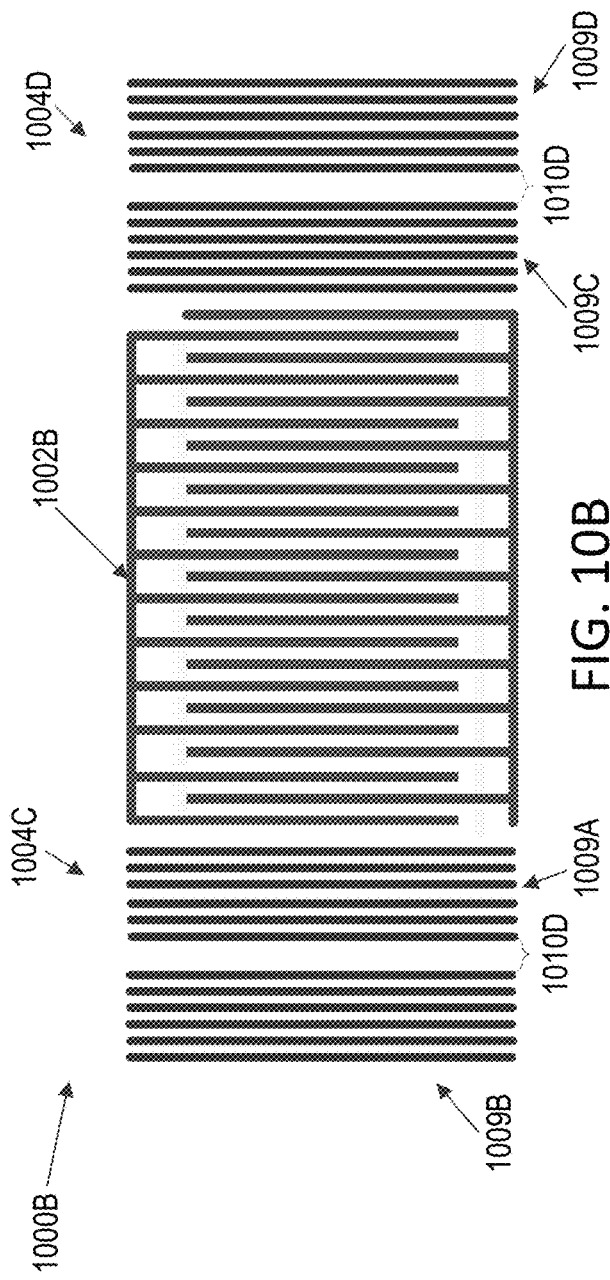

FIGS. 10A-B depict various spatial arrangements of SAW reflectors of SAW sensors 1000A-B, according to aspects of the present disclosure. The SAW sensors 1000A-B include an IDT 1002A-B and one or more collections of SAW reflectors 1004A-D disposed in a spatial arrangement on a piezoelectric substrate or on a substrate (e.g., a semiconductor substrate) with a piezoelectric layer disposed thereon. The IDT 1002A-B is designed to receive an electrical signal and generate a SAW that propagates across a surface of the piezoelectric material of the piezoelectric substrate or piezoelectric layer. The generated SAW is reflected by the SAW reflectors 1004A-D and returned to the IDT 1002A-B. The IDT 1002A-B generates a new electrical potential associated with the reflected SAW. The SAW reflectors can be spatially arranged to apply a signal modulation to the reflected SAW waves that are returning to the IDT 1002A-B.

As shown, a single IDT 1002A-B both generates a SAW based on a received RF signal and receives a reflection of the SAW and generates a new RF signal therefrom. In such an embodiment, the generation of the SAW and the receipt of the reflected SAW are offset in time, such that at time 1 an RF signal is received and at time 2 a new RF signal is generated. In some embodiments (not shown), two IDTs are disposed side-by-side or adjacent to one another. The first IDT may receive an RF signal and generate a SAW, and the second IDT may receive the reflected SAW and generate a new RF signal. In such a configuration, the first IDT and second IDT may operate in parallel. Thus, the second IDT may output the new RF signal while the first IDT is receiving the incoming RF signal.

Embodiments of the present disclosure include various spatial arrangements of SAW reflectors 1004A-D. For example, as shown in SAW reflectors 1004A-B, a SAW sensor may include a collection of SAW reflectors that are uniformly distributed. In another example, a SAW sensor may include a collection of SAW reflectors that are not uniformly distributed and that may be uniquely spaced. In another example, as shown in SAW reflectors 1004C-D, a SAW sensor may include one or more collection of SAW reflectors that are grouped together. In another example, as shown in SAW reflectors 1004D, a SAW sensor may include one or more collection of SAW reflectors that are grouped with diverse spacing.

In some embodiments, the spatial arrangement of SAW reflectors 1004A-D results in a signal modulation that identifies the SAW sensor. For example, each of the previously described examples depicted in FIGS. 10A-B may result in signal modulations that are unique to each SAW sensor. For example, the signal modulation may result in phase changes, frequency changes, and/or signal delays as a result of the constructive and deconstructive interference of the reflected SAWs when returning to the IDT 1002A-B.

For example, the spacing 1010A-D between groups of SAW reflectors may result in unique signal modulations. For example, in FIG. 10B SAW reflectors 1004C are divided into a first group of reflectors 1009A and a second group of reflectors 1009B, and SAW reflectors 1004D are divided into a first group of reflectors 1009C and a second group of reflectors 1009D. All of the reflectors in the first groups 1009A, 1009C have a first pitch or spacing, and all of the reflectors in the second groups 1009B, 1009D also have the first pitch or spacing. The first pitch or spacing may be, for example, approximately a spacing of one wavelength for a SAW. First group 1009A may be separated from second group 1009B by a gap or space 1010D, which may not be a full wavelength of the SAW. Similarly, first group 1009C may be separated from second group 1009D by the gap or space 1010D. In embodiments, the gap or space 1010D may have a length that is a quarter wavelength, a half wavelength, three quarters of a wavelength, one and a quarter wavelength, one and a half wavelength, one and three quarters wavelength, two and a quarter wavelength, two and a half wavelength, two and three quarters wavelength, and so on. In a further example, the spatial distribution of the SAW reflectors 1004A-D may include half and/or quarter wavelength spacing between SAW reflectors. In some embodiments, SAW reflectors are arranged in groups, where a first group of SAW reflectors may be offset from a second group of SAW reflectors by, for example, a half wavelength or a quarter wavelength. In one embodiment, each SAW reflector of the first group of SAW reflectors is spaced from one or more nearest SAW reflector of the group by a spacing, which may correspond to the wavelength of the SAW. Additionally, each SAW reflector of the second group of SAW reflectors may be spaced from one or more nearest SAW reflector from that group by the spacing, which may correspond to the wavelength of the SAW. In some embodiments, combinations of half-wavelength, quarter-wavelength and/or full wavelength spacing may be used to generate unique signal modulation that may identify the SAW sensor 1000A-B In some embodiments, the SAW sensors 1000A-B may be a part of a sensor assembly (e.g., SAW sensor assembly 210 of FIG. 2) of a sensor device (e.g., sensor device 200 of FIG. 2). Various SAW sensor assemblies may be disposed across a base substrate (e.g., wafer) each including a SAW sensor with an IDT and a collection of SAW reflectors disposed in a unique spatial arrangement. Each SAW sensor may measure an environmental condition and return the information in a signal having a signal modulation that identifies the SAW sensor assembly that transmitted the information. It can be appreciated that by having unique signal modulations, each sensor can operate within overlapping or even equivalent resonant frequency ranges and still be differentiated from other sensors. For example, a measured environmental condition can be mapped to a first region of the base substrate because the signal transmitting the information associated with the environmental condition also includes a signal modulation identifying a sensor located in the first region of the base substrate.

In some embodiments, the spatial arrangement of SAW reflectors may be combined with other embodiments of the present disclosure to identify a SAW sensor. For example, a unique spatial arrangement of SAW reflectors 1004A-D of a SAW sensor may be combined with a unique arrangement of interlocking digits 910 of the IDT as discussed in association with FIG. 9A-FIG. 9C. This may result in a further modulated signal that uniquely identifies a SAW sensor. In another example, a unique spatial arrangement of SAW reflectors 1004 may be combined with an applied dielectric coating 530 as discussed in association with FIG. 5A and FIG. 5B. This may result in a signal modulation combined with a tuned frequency that uniquely identifies a SAW sensor.

FIG. 11-14 are top, perspective views of various embodiments of sensor devices 1100-1400, according to aspects of the disclosure. The sensor devices include a substrate 1102-1402 having at least a layer of a piezoelectric material (e.g., a piezoelectric substrate or a semiconductor substrate with a piezoelectric layer disposed thereon) and SAW sensor assemblies 1104-1404 and 1108-1208 that are designed to receive and/or transmit RF signals associated with measuring an environmental condition of an environment using SAWs 1106-1406. The sensor assemblies may include RF antennas, matching circuitry, and SAW sensors having IDTs. The sensor assemblies may include features and configurations of SAW sensor assemblies disclosed elsewhere herein (e.g., sensor device 200). The following exemplary embodiments disclose various configurations of transmitting SAWs between multiple sensor assemblies to measure an environmental condition in a region on the surface of the piezoelectric material between the multiple sensor assemblies.

Figure 11:
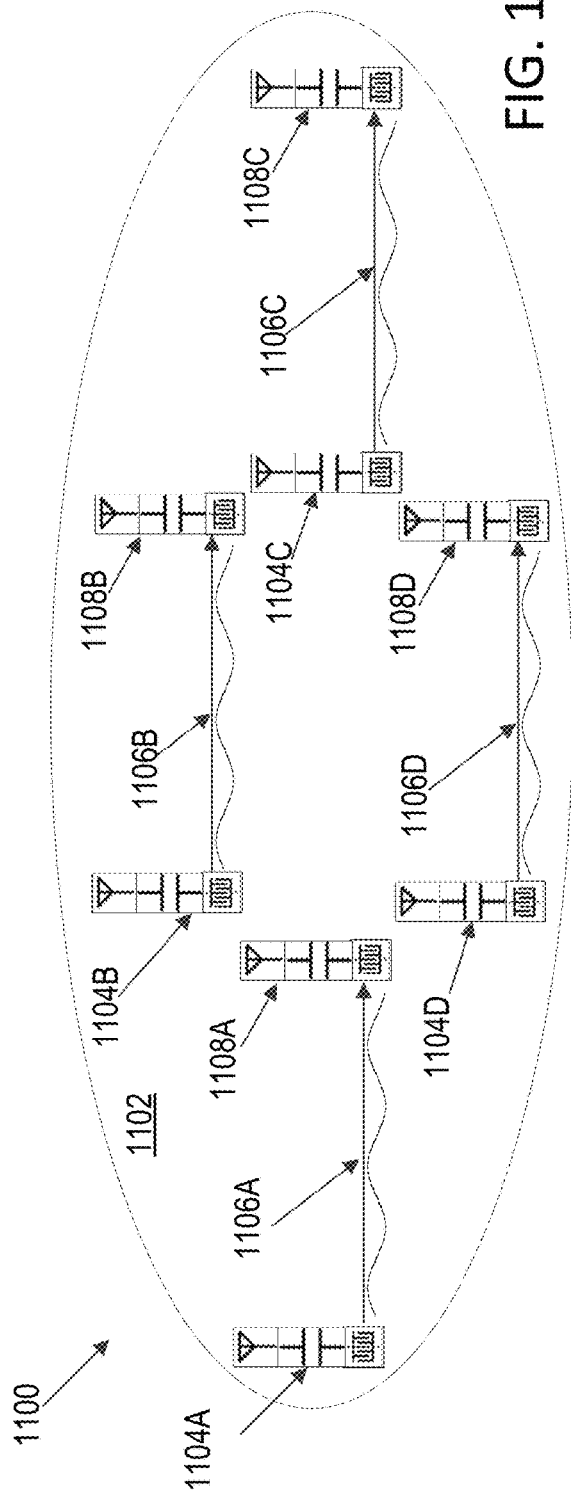
FIGS. 11-14 are top, perspective views of various embodiments of sensor devices, according to aspects of the disclosure.

In some embodiments, for example, as shown in FIG. 11, the sensor device 1100 may include a first SAW sensor assembly 1104A designed to receive incoming RF signals and generate a SAW 1106A that propagates across the surface of the substrate 1102, which may be a piezoelectric substrate or a substrate with a piezoelectric layer disposed thereon. The SAW 1106 is received by a second SAW sensor assemblies 1108A designed to generate an electrical potential associated with the received SAW 1106A and output an outgoing RF signal associated with the electrical potential, where the outgoing RF signal output includes information indicative of an environmental condition of an environment between the first SAW sensor assembly 1104A and second SAW sensor assembly 1108A. In some embodiments, a waveguide is disposed between the first SAW sensor assembly 1104A and the second SAW sensor assembly 1108A. The waveguide can maintain the SAW that propagates between first SAW sensor assembly 1104A and second SAW sensor assembly 1108A. In some embodiments, the first SAW sensor assembly 1104A and second SAW sensor assembly 1108A are part of a single integrated device. In some embodiments, matching networks and/or antennas of the SAW sensor assemblies 1104A, 1108A are not part of the integrated device, and are instead discrete components. In some embodiments, a waveguide disposed between the first SAW sensor assembly 1104A and second SAW sensor assembly 1108A is part of an integrated device along with the first and/or second SAW sensor assemblies 1104A, 1108A. In a further embodiment, the sensor device may include a first set of SAW sensor assemblies 1104 that each generate SAWs 1106 that are received by a second set of SAW sensor assemblies 1108. Each of the SAW sensor assemblies may be part of a single integrated device in embodiments. In some embodiments, waveguides are disposed between one or more respective pairs of first SAW sensor assemblies 1104A-D and second SAW sensor assemblies 1108A-D.

Figure 12:
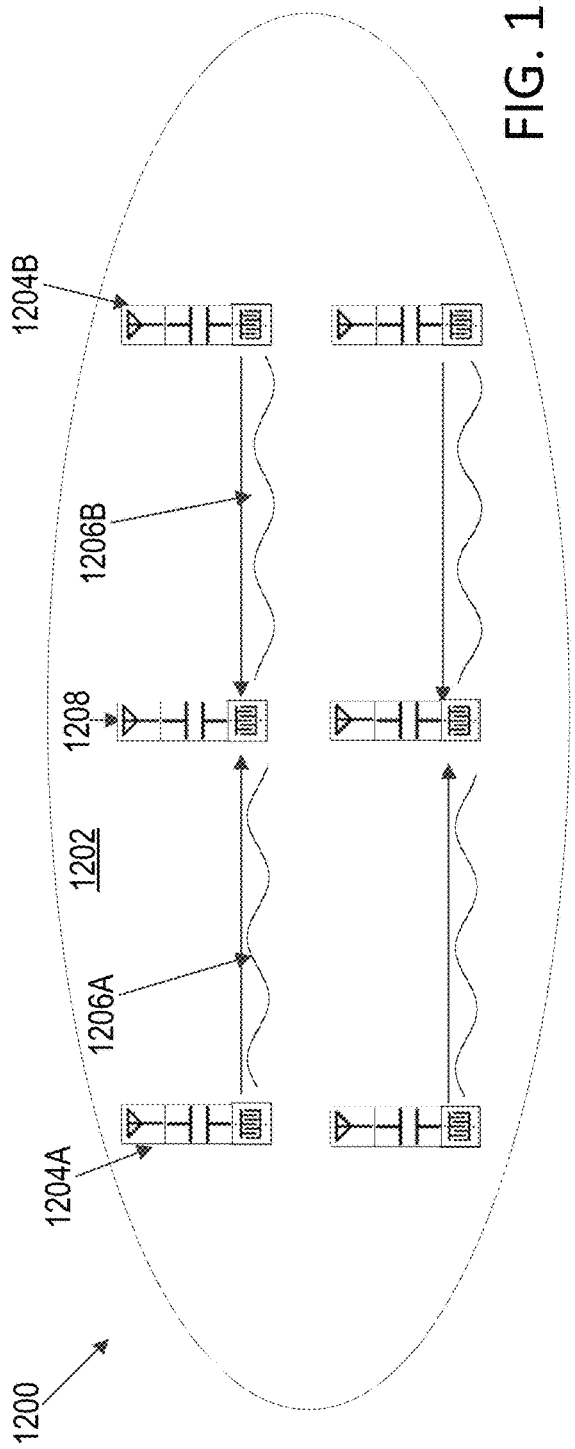

In some embodiments, for example, as shown in FIG. 12, the sensor device 1200 may include a set of SAW generating sensor assemblies 1204 that are designed to receive incoming RF signals and generate SAWs 1206 that propagate across the surface of the substrate 1202, which may be a piezoelectric substrate or a substrate with a piezoelectric layer. The sensor device 1200 may also include a SAW receiving sensor assembly 1208 that is designed to receive the SAWs 1206 generated by the set of SAW generating sensor assemblies 1204. The SAW receiving sensor assembly 1208 may be designed to generate an oscillating electric potential associated with each of the SAWs 1206 generated by the SAW generating sensor assemblies 1204. The SAW receiving sensor assembly 1208 outputs an outgoing RF signal in accordance with each oscillating electric potential, where each RF signal includes information indicative of an environmental condition of an environment disposed between the SAW receiving sensor assembly 1208 and the associated SAW generating sensor assembly (e.g., 1204A). A first waveguide may be disposed between SAW generating sensor assembly 1208 and first SAW sensor assembly 1204A, and a second waveguide may be disposed between SAW generating assembly 1208 and second SAW sensor assembly 1204B in some embodiments. In some embodiments, the first SAW sensor assembly 1204A, second SAW sensor assembly 1204B and SAW receiving sensor assembly 1208 are part of a single integrated device. In some embodiments, matching networks and/or antennas of the SAW sensor assemblies 1204A, 1204B, 1208 are not part of the integrated device, and are instead discrete components. In some embodiments, a first waveguide disposed between the first SAW sensor assembly 1204A and SAW receiving sensor assembly 1208 and a second waveguide disposed between the second SAW sensor assembly 1204B and SAW receiving sensor assembly 1208 is part of an integrated device along with the first SAW sensor assembly 1204A, second SAW sensor assembly 1204B and/or SAW receiving sensor assembly 1208. In a further embodiment, the sensor device 1200 may include multiple sets of SAW generating sensor assemblies (e.g., 1204) and multiple SAW receiving sensor assemblies (e.g., 1208) to receive SAWs (e.g., 1206) generated by each set of SAW generating sensor assembles.

Figure 13:
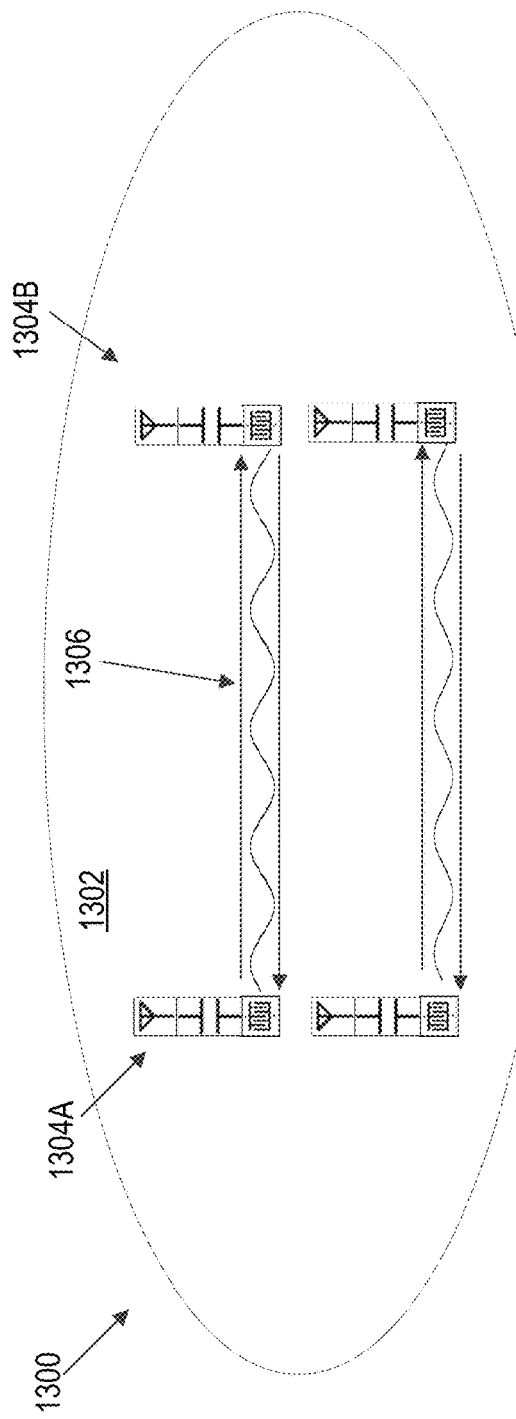

In some embodiments, for example, as shown in FIG. 13, the sensor device 1300 may include two sensor assemblies 1304A and 1304B each disposed on a piezoelectric substrate 1302 (or substrate with a piezoelectric layer disposed thereon). Each sensor assembly 1304A and 1304B may receive an incoming RF signal and generate a SAW 1306 associated with the received incoming RF signal. The SAW 1306 generated by each signal is received by the other sensor assembly. For example, a SAW 1306 generated by a first sensor assembly 1304A is received by a second sensor assembly 1304B and a SAW 1306 generated by the second sensor assembly 1304B is received by the first sensor assembly 1304A. Each sensor assembly 1304 may generate an oscillating electric potential associated with the corresponding SAW 1306 received by each sensor assembly 1304. Each sensor assembly 1304 may output an outgoing RF signal in accordance with each oscillating electric potential, where each outgoing RF signal includes information indicative of an environmental condition of an environment disposed between the two sensor assemblies 1304A and 1304B. In a further embodiment, a processing system (e.g., processing system 100 of FIG. 1) may coordinate sending incoming RF signals such that the sensor assemblies alternate roles of SAW generation and oscillating electric potential generation. In a different embodiment, a processing system may coordinate sending incoming RF signals such that each sensor assembly 1304 generates SAWs synchronous with the other sensor assembly 1304. In a further embodiment, the sensor device 1300 may include multiple pairs of sensor that operate in accordance with previously described exemplary embodiments detailing sensor assembly 1304A and 1304B.

In some embodiments, a waveguide is disposed between the first SAW sensor assembly 1304A and the second SAW sensor assembly 1304B. In some embodiments, the first SAW sensor assembly 1304A and second SAW sensor assembly 1304B are part of a single integrated device. In some embodiments, matching networks and/or antennas of the SAW sensor assemblies 1304A-B are not part of the integrated device, and are instead discrete components. In some embodiments, a waveguide disposed between the first SAW sensor assembly 1304A and second SAW sensor assembly 1304B is part of an integrated device along with the first and/or second SAW sensor assemblies 1304A, 1304B.

Figure 14:
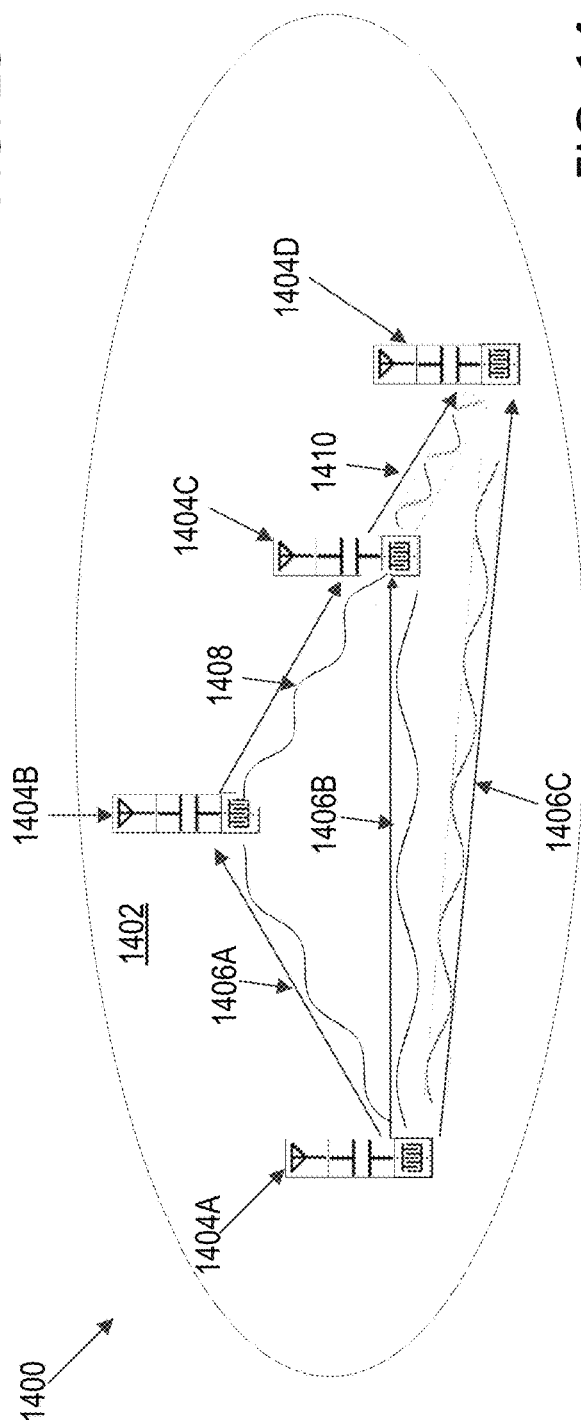

In some embodiments, as shown in FIG. 14, the sensor device 1400 may include multiple sensor assemblies 1404 disposed on a surface of a substrate 1402 having at least a layer of a piezoelectric material. The sensor device 1400 may include a SAW sensor assembly 1404A that is designed to receive an incoming RF signal and generate SAWs 1406 that are to be received by multiple SAW sensor assemblies 1404B, 1404C, and 1404D. The sensor device 1400 may include a SAW sensor assembly 1404B that is designed to receive a SAW 1406A from another SAW sensor assembly 1404A and generate an oscillating electric potential associated with the SAW and output an incoming RF signal associated with the generated oscillating electric potential. SAW sensor assembly 1404B may also be designed to generate a SAW 1408 responsive to receiving an incoming RF signal. The sensor device may further include a SAW sensor assembly 1404C that is designed to receive SAWs 1408 and 1406B from multiple SAW sensor assemblies 1404A and 1404B. SAW sensor assembly 1404C may generate oscillating electric potentials for each of the received SAWs and output outgoing RF signals associated with each of the generated oscillating electric potentials. SAW sensor assembly 1404C may also be designed to generate a SAW 1410 responsive to receiving an incoming RF signal. The sensor device may further include a SAW sensor assembly 1404D that is designed to receive SAWs 1410 and 1406C from multiple SAW sensor assemblies 1404C and 1404A. SAW sensor assembly 1404D may generate electric potentials for each of the received SAWs and output outgoing RF signals associated with each of the generated oscillating electric potentials.

In some embodiments, one or more of the SAW sensor assemblies 1404A-D are part of a same integrated device. In some embodiments, waveguides are disposed between one or more of the SAW sensor assemblies 1404A-D, such as between SAW sensor assembly 1404A and SAW sensor assembly 1404D and/or between SAW sensor assembly 1404A and SAW sensor assembly 1404C. The waveguides may be part of an integrated device with the one or more SAW sensor assemblies in embodiments. For example, the waveguides may be planar conductors formed on the piezoelectric material on which the SAW sensor assemblies are formed.

In some embodiments, combinations of embodiments shown in FIGS. 11-14 are used. For example, sensor assemblies 1104, 1108, 1204, 1208, 1304, and 1404 can be used in any combination with each other on the surface of a piezoelectric substrate to measure environmental conditions at different regions across the surface of a piezoelectric substrate responsive to receiving incoming RF signals.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A sensor device comprising:
a first integrated sensor assembly, the first integrated sensor assembly comprising:
a first surface acoustic wave (SAW) sensor disposed on a substrate comprising at least a layer of a piezoelectric material, wherein the first SAW sensor is adapted to measure an environmental condition of an environment responsive to receiving a first incoming RF signal, the first SAW sensor comprising:
a first interdigitated transducer (IDT) formed on a first region of the piezoelectric material, the first IDT to generate a first SAW based on the environmental condition, responsive to receiving the first incoming RF signal; and
a second IDT formed on a second region of the piezoelectric material, wherein the second IDT is to receive the first SAW from the first IDT and generate a first oscillating electric potential associated with a first acoustic frequency of the received first SAW,
a first RF antenna formed on a third region of the piezoelectric material; and
a second RF antenna, coupled to the second IDT, formed on a fourth region of the piezoelectric material; wherein the first SAW sensor and the first RF antenna and the second RF antenna are integrated with one another on the piezoelectric material, and wherein:
the second RF antenna is to receive the first incoming RF signal;
the second IDT is further to generate a second SAW based on the environmental condition responsive to receiving the first incoming RF signal;
the first IDT is further to receive the second SAW from the second IDT;
the first IDT is further to generate a second oscillating electric potential associated with a second acoustic frequency of the received SAW; and
the first RF antenna is further to output an outgoing RF signal in accordance with the second oscillating electric potential.

2. The sensor device of claim 1, wherein the first integrated sensor assembly further comprises matching circuitry coupled to the first RF antenna and to the first IDT and formed on a fifth region of the piezoelectric material.

3. The sensor device of claim 2, wherein the first RF antenna, the matching circuitry, the first IDT, and the second IDT each comprise one or more planar conductors disposed on the piezoelectric material.

4. The sensor device of claim 2, further comprising a protective coating or cover disposed on the first RF antenna and the matching circuitry.

5. The sensor device of claim 1, further comprising:
a second integrated sensor assembly, the second integrated sensor assembly comprising:
a second SAW sensor disposed on the piezoelectric material, wherein the second SAW sensor is adapted to measure the environmental condition of the environment responsive to receiving the first incoming RF signal or a second incoming RF signal, the second SAW sensor comprising:
a third IDT formed on a fifth region of the piezoelectric material; and
at least one of a) one or more additional SAW reflectors communicatively coupled to the third IDT and formed on a sixth region of the piezoelectric material or b) a fourth IDT formed on a seventh region of the piezoelectric material; and
a third RF antenna coupled to the third IDT and formed on an eighth region of the piezoelectric material;
wherein the second SAW sensor and the third RF antenna are integrated with one another on the piezoelectric material and the first SAW sensor is adapted to operate in a first frequency range and the second SAW sensor is adapted to operate in a second frequency range that is different than the first frequency range.

6. The sensor device of claim 1, wherein the substrate comprises a piezoelectric substrate comprising the piezoelectric material.

7. The sensor device of claim 1, wherein the substrate comprises a substrate composed of a first material and a piezoelectric layer on the substrate, wherein the piezoelectric layer comprises the piezoelectric material.

8. The sensor device of claim 1, wherein:
the second RF antenna is further to receive a second incoming RF signal;
the second IDT is further to generate a third SAW based on the environmental condition responsive to receiving the second incoming RF signal;
the first IDT is further to:
receive the third SAW from the second IDT; and
generate a third oscillating electric potential associated with a third acoustic frequency of the received third SAW; and
the first RF antenna is further to output a second outgoing RF signal in accordance with the third oscillating electric potential.

9. The sensor device of claim 1, wherein the first integrated sensor assembly further comprises:
a third IDT formed on a fifth region of the piezoelectric material, wherein the third IDT is to:
receive the first SAW from the first IDT; and
generate a third oscillating electric potential associated with the first acoustic frequency of the received first SAW; and
a third RF antenna coupled to the third IDT, wherein the third RF antenna is further to output a second outgoing RF signal in accordance with the third oscillating electric potential.

10. The sensor device of claim 9, wherein:
the second RF antenna is further to receive the first incoming RF signal or a second incoming RF signal;
the second IDT is further to generate a third SAW based on the environmental condition, responsive to receiving the first incoming RF signal or the second incoming RF signal;
the third IDT is further to:
receive the third SAW from the second IDT; and
generate a fourth oscillating electric potential associated with a combination of the first acoustic frequency of the received first SAW and a second acoustic frequency of the received third SAW; and
the third RF antenna is further to output a third outgoing RF signal in accordance with the fourth oscillating electric potential.

11. The sensor device of claim 1, the first integrated sensor assembly further comprises:
a third IDT formed on a fifth region of the piezoelectric material; and a third RF antenna coupled to the third IDT, wherein:
the second RF antenna is further to receive the first incoming RF signal or a second incoming RF signal;
the second IDT is further to generate a third SAW based on the environmental condition responsive to receiving the first incoming RF signal or the second incoming RF signal;
the third IDT is further to:
  receive the third SAW from the second IDT; and
  generate a third oscillating electric potential associated with an acoustic frequency of the received third SAW;
and
the third RF antenna is further to output a second outgoing RF signal in accordance with the third oscillating electric potential.

12. The sensor device of claim 1, wherein the first integrated sensor assembly further comprises:
a third IDT formed on a fifth region of the piezoelectric material; and
a third RF antenna coupled to the third IDT, wherein:
the third RF antenna is further to receive the first incoming RF signal or a second incoming RF signal;
the third IDT is further to generate a third SAW based on the environmental condition, responsive to receiving the incoming first RF signal or the second incoming RF signal;
the second IDT is to:
  receive the third SAW from the third IDT; and
  generate a third oscillating electric potential associated with a combination of the first acoustic frequency of the received first SAW and a third acoustic frequency of the received third SAW; and
the second RF antenna is further to output a second outgoing RF signal in accordance with the third oscillating electric potential.

13. The sensor device of claim 1, wherein the first SAW sensor further comprises a waveguide formed on the piezoelectric material between the first IDT and the second IDT.

14. An integrated sensor device comprising:
a first surface acoustic wave (SAW) sensor disposed on a substrate comprising at least a layer of a piezoelectric material, wherein the first SAW sensor is adapted to measure an environmental condition of an environment responsive to receiving a first incoming RF signal, the first SAW sensor comprising a first interdigitated transducer (IDT) formed on a first region of the piezoelectric material, the first IDT to generate a first SAW based on the environmental condition, responsive to receiving the first incoming RF signal; and
a second SAW sensor disposed on the piezoelectric material, wherein the second SAW sensor is adapted to measure the environmental condition of the environment responsive to receiving the first incoming RF signal or a second incoming RF signal, the second SAW sensor comprising a second IDT formed on a second region of the piezoelectric material, the second IDT to generate a second SAW based on the environmental condition responsive to receiving the first incoming RF signal or the second incoming RF signal, wherein the second IDT is further to receive the first SAW from the first IDT and generate a first oscillating electric potential associated with a first acoustic frequency of the received first SAW, and wherein the second IDT is coupled to an RF antenna which is to output a first outgoing RF signal in accordance with the first oscillating electric potential; and wherein the first SAW sensor is adapted to operate in a first frequency range and the second SAW sensor is adapted to operate in a second frequency range that is different than the first frequency range, wherein the first SAW sensor is disposed on a first surface of the substrate and the second SAW sensor is disposed on a second surface of the substrate.

* * * * *